(12) United States Patent
Yang et al.

(10) Patent No.: US 12,302,678 B2
(45) Date of Patent: May 13, 2025

(54) PIXEL CIRCUIT, ARRAY SUBSTRATE AND DISPLAY PANEL

(71) Applicant: BOE TECHNOLOGY GROUP CO., LTD., Beijing (CN)

(72) Inventors: Ming Yang, Beijing (CN); Seungwoo Han, Beijing (CN); Zhuo Li, Beijing (CN); Dingchang Zhang, Beijing (CN); Xuan Feng, Beijing (CN); Hui Zhang, Beijing (CN); Liwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/648,499

(22) Filed: Apr. 29, 2024

(65) Prior Publication Data

US 2024/0395993 A1    Nov. 28, 2024

Related U.S. Application Data

(63) Continuation of application No. PCT/CN2023/096657, filed on May 26, 2023.

(51) Int. Cl.
*H10H 20/80* (2025.01)
*G09G 3/32* (2016.01)
(Continued)

(52) U.S. Cl.
CPC ......... *H10H 20/857* (2025.01); *G09G 3/3233* (2013.01); *H01L 25/167* (2013.01);
(Continued)

(58) Field of Classification Search
CPC ...... H10H 20/857; G09G 3/3233; G09G 3/32; G09G 2300/0426; G09G 2300/0819;
(Continued)

(56) References Cited

U.S. PATENT DOCUMENTS

2006/0145951 A1   7/2006   Watanabe et al.
2020/0043400 A1   2/2020   Chen et al.
(Continued)

FOREIGN PATENT DOCUMENTS

CN    105023522 A    11/2015
CN    106206651 A    12/2016
(Continued)

OTHER PUBLICATIONS

International Search Report and Written Opinion for International Application No. PCT/CN2023/096657 issued by the International Searching Authority on Dec. 8, 2023.

*Primary Examiner* — Pegeman Karimi
(74) *Attorney, Agent, or Firm* — XSENSUS LLP

(57) ABSTRACT

A pixel circuit includes a pixel driving circuit and a bonding unit connected thereto. The bonding unit includes a first bonding terminal group and at least one second bonding terminal group that are arranged in parallel, and the first bonding terminal group and a second bonding terminal group are configured to bond light-emitting devices. The first bonding terminal group includes a first terminal and a second terminal, and the second bonding terminal group includes a third terminal and a fourth terminal. The first terminal and the third terminal are connected, and are both connected to the pixel driving circuit; the second terminal and the fourth terminal are connected, and are both connected to a set voltage signal line.

20 Claims, 19 Drawing Sheets

(51) Int. Cl.
*G09G 3/3233* (2016.01)
*H01L 25/16* (2023.01)
*H10D 86/40* (2025.01)
*H10D 86/60* (2025.01)
*H10H 20/857* (2025.01)

(52) U.S. Cl.
CPC ........... H10D 86/441 (2025.01); H10D 86/60 (2025.01); *G09G 3/32* (2013.01); *G09G 2300/0426* (2013.01); *G09G 2300/0819* (2013.01); *G09G 2300/0842* (2013.01); *G09G 2300/0861* (2013.01); *G09G 2330/04* (2013.01)

(58) Field of Classification Search
CPC ... G09G 2300/0842; G09G 2300/0861; G09G 2330/04; H01L 25/167; H10D 86/441; H10D 86/60; H10D 10/821; H10D 30/0295; H10D 64/511
See application file for complete search history.

(56) References Cited

U.S. PATENT DOCUMENTS

| | | | |
|---|---|---|---|
| 2021/0012706 A1* | 1/2021 | Yang | G09G 3/32 |
| 2022/0069058 A1 | 3/2022 | Han et al. | |
| 2022/0101801 A1 | 3/2022 | Zhang et al. | |
| 2022/0246091 A1 | 8/2022 | Yin et al. | |
| 2022/0310568 A1* | 9/2022 | Liu | H01L 33/62 |
| 2022/0406245 A1* | 12/2022 | Chen | G01R 31/54 |
| 2023/0154386 A1* | 5/2023 | Yang | G02F 1/133603 |

FOREIGN PATENT DOCUMENTS

| | | |
|---|---|---|
| CN | 111834513 A | 10/2020 |
| CN | 111862839 A | 10/2020 |
| CN | 112490226 A | 3/2021 |
| CN | 114822374 A | 7/2022 |
| KR | 10-2017-0003088 A | 1/2017 |

* cited by examiner

PIXEL CIRCUIT, ARRAY SUBSTRATE AND DISPLAY PANEL

CROSS-REFERENCE TO RELATED APPLICATION

This application is a Bypass Continuation application of International Patent Application No. PCT/CN2023/096657, filed on May 26, 2023, which is incorporated herein by reference in its entirety.

TECHNICAL FIELD

The present disclosure relates to the field of display technologies, and in particular, to a pixel circuit, an array substrate and a display panel.

BACKGROUND

Mini light-emitting diode (mini LED) display apparatuses and micro light-emitting diode (micro LED) display apparatuses are display apparatuses composed of a large number of small-sized LEDs that are arranged an array, and they have advantages such as high brightness, clear display and low power consumption, and have good application prospects.

A mass transfer process for mini LED chips in the mini LED display apparatus and micro LED chips in the micro LED display apparatus is difficult, multiple transfers are needed, and the amount of chips transferred each time is very large, which requires high stability and accuracy for the transfer process. Therefore, the mass transfer technology has become one of the current research hotspots.

SUMMARY

In an aspect, a pixel circuit is provided. The pixel circuit includes a pixel driving circuit and a bonding unit connected to the pixel driving circuit. The bonding unit includes a first bonding terminal group and at least one second bonding terminal group that are arranged in parallel, and the first bonding terminal group and a second bonding terminal group are configured to bond light-emitting devices. The first bonding terminal group includes a first terminal and a second terminal, and the second bonding terminal group includes a third terminal and a fourth terminal; the first terminal and the third terminal are connected, and are both connected to the pixel driving circuit; the second terminal and the fourth terminal are connected, and are both connected to a set voltage signal line.

In some embodiments, the pixel driving circuit is electrically connected to a first voltage signal line, and the set voltage signal line is a second voltage signal line; or the pixel driving circuit is electrically connected to the second voltage signal line, and the set voltage signal line is the first voltage signal line. The first voltage signal line is configured to transmit a first voltage signal, the second voltage signal line is configured to transmit a second voltage signal, and a voltage of the first voltage signal is greater than a voltage of the second voltage signal.

In some embodiments, the pixel circuit further includes an electrostatic protection circuit. The first terminal and the third terminal are connected to a first connection node, and the electrostatic protection circuit is electrically connected to the first connection node. The electrostatic protection circuit includes a first electrostatic protection circuit, and the first electrostatic protection circuit includes a first sub-circuit and a second sub-circuit. A first terminal of the first sub-circuit and a second terminal of the second sub-circuit are electrically connected to a first connection point; a second terminal of the first sub-circuit is electrically connected to a third voltage signal line, and a first terminal of the second sub-circuit is electrically connected to a fourth voltage signal line. The third voltage signal line is configured to transmit a third voltage signal, and the fourth voltage signal line is configured to transmit a fourth voltage signal; a voltage of the third voltage signal is greater than a voltage of the fourth voltage signal. The first sub-circuit is configured to be turned on when an abnormal high voltage occurs at the first connection node, so that the first connection point discharges to the third voltage signal line; and the second sub-circuit is configured to be turned on when an abnormal low voltage occurs at the first connection node, so that the fourth voltage signal line charges the first connection point.

In some embodiments, the first sub-circuit includes at least one first transistor. The first sub-circuit includes one first transistor; a gate of the first transistor is electrically connected to a second electrode thereof, a first electrode of the first transistor is electrically connected to the first connection point, and the second electrode of the first transistor is electrically connected to the third voltage signal line. Alternatively, the first sub-circuit includes at least two first transistors connected in series; a gate of each first transistor is electrically connected to a second electrode thereof, a first electrode of a first transistor in the at least two first transistors is electrically connected to the first connection point, and a second electrode of a last first transistor in the at least two first transistors is electrically connected to the third voltage signal line.

In some embodiments, the second sub-circuit includes at least one second transistor. The second sub-circuit includes one second transistor; a gate of the second transistor is electrically connected to a second electrode thereof, a first electrode of the second transistor is electrically connected to the fourth voltage signal line, and the second electrode of the second transistor is electrically connected to the first connection point. Alternatively, the second sub-circuit includes at least two second transistors connected in series; a gate of each second transistor is electrically connected to a second electrode thereof, a first electrode of a first second transistor in the at least two second transistors is electrically connected to the fourth voltage signal line, and a second electrode of a last second transistor in the at least two second transistors is electrically connected to the first connection point.

In some embodiments, the second terminal and the fourth terminal are connected to a second connection node, and the electrostatic protection circuit is further electrically connected to the second connection node. The electrostatic protection circuit further includes a second electrostatic protection circuit, and the second electrostatic protection circuit includes a third sub-circuit and a fourth sub-circuit. A first terminal of the third sub-circuit and a second terminal of the fourth sub-circuit are electrically connected to a second connection point; a second terminal of the third sub-circuit is electrically connected to the third voltage signal line; a first terminal of the fourth sub-circuit is electrically connected to the fourth voltage signal line. The third sub-circuit is configured to be turned on when an abnormal high voltage occurs at the second connection node, so that the second connection point discharges to the third voltage signal line; and the fourth sub-circuit is configured to be turned on when an abnormal low voltage occurs at the second connection node, so that the fourth voltage signal line charges the second connection point.

In some embodiments, the third sub-circuit includes at least one third transistor. The third sub-circuit includes one third transistor; a gate of the third transistor is electrically connected to a second electrode thereof, a first electrode of the third transistor is electrically connected to the second connection point, and the second electrode of the third transistor is electrically connected to the third voltage signal line. Alternatively, the third sub-circuit includes at least two third transistors connected in series; a gate of each third transistor is electrically connected to a second electrode thereof, a first electrode of a first third transistor in the at least two third transistors is electrically connected to the second connection point, and a second electrode of a last third transistor in the at least two third transistors is electrically connected to the third voltage signal line.

In some embodiments, the fourth sub-circuit includes at least one fourth transistor. The fourth sub-circuit includes one fourth transistor; a gate of the fourth transistor is electrically connected to a second electrode thereof, a first electrode of the fourth transistor is electrically connected to the fourth voltage signal line, and the second electrode of the fourth transistor is electrically connected to the second connection point. Alternatively, the fourth sub-circuit includes at least two fourth transistors connected in series; a gate of each fourth transistor is electrically connected to a second electrode thereof, a first electrode of a first fourth transistor in the at least two fourth transistors is electrically connected to the fourth voltage signal line, and a second electrode of a last fourth transistor in the at least two fourth transistors is electrically connected to the second connection point.

In some embodiments, the pixel driving circuit includes a first reset transistor, a compensation transistor, a driving transistor, a writing transistor, a first light-emitting control transistor, a second light-emitting control transistor, a second reset transistor and a first capacitor. In the first reset transistor, a gate is electrically connected to a reset signal line, a first electrode is electrically connected to a first node, and a second electrode is electrically connected to a first initialization signal line. In the compensation transistor, a gate is electrically connected to a first scan signal line, a first electrode is electrically connected to the first node, and a second electrode is electrically connected to a second node. In the driving transistor, a gate is electrically connected to the first node, a first electrode is electrically connected to a third node, and a second electrode is electrically connected to the second node. In the writing transistor, a gate is electrically connected to the first scan signal line, a first electrode is electrically connected to the third node, and a second electrode is electrically connected to a first data signal line. In the first light-emitting control transistor, a gate is electrically connected to a light-emitting control signal line, a first electrode is electrically connected to a first voltage signal line, and a second electrode is electrically connected to the third node. In the second light-emitting control transistor, a gate is electrically connected to the light-emitting control signal line, a first electrode is electrically connected to the second node, and a second electrode is electrically connected to a fourth node. In the second reset transistor, a gate is electrically connected to a second scan signal line, a first electrode is electrically connected to a second initialization signal line, and a second electrode is electrically connected to the fourth node. In the first capacitor, a first electrode plate is electrically connected to the first voltage signal line, and a second electrode plate is electrically connected to the first node.

In some embodiments, the fourth node of the pixel driving circuit is electrically connected to the first terminal and the third terminal of the bonding unit.

In another aspect, an array substrate is provided. The array substrate includes a plurality of pixel circuits as described in any of the above embodiments. The array substrate includes a substrate, a semiconductor layer, a first gate layer, a second gate layer, a first source-drain metal layer, a second source-drain metal layer, and a bonding layer that are stacked. The set voltage signal line is located in the first source-drain metal layer or the second source-drain metal layer. The pixel driving circuit is located in the semiconductor layer, the first gate layer, the second gate layer and the first source-drain metal layer. The bonding unit is located in the bonding layer; in a region where at least one pixel circuit is located, the bonding layer includes a first bonding pattern group and at least one second bonding pattern group, the first bonding pattern group includes a first bonding pattern and a second bonding pattern, and a second bonding pattern group includes a third bonding pattern and a fourth bonding pattern. The first bonding pattern group serves as the first bonding terminal group, and the second bonding pattern group serves as the second bonding terminal group. The first bonding pattern and the third bonding pattern are both electrically connected to the pixel driving circuit, and the second bonding pattern and the fourth bonding pattern are both electrically connected to the set voltage signal line.

In some embodiments, the second source-drain metal layer includes a first source-drain pattern group and at least one second source-drain pattern group; the first source-drain pattern group includes a first source-drain pattern and a second source-drain pattern, and a second source-drain pattern group includes a third source-drain pattern and a fourth source-drain pattern. The first source-drain pattern is electrically connected to the first bonding pattern, and the second source-drain pattern is electrically connected to the second bonding pattern; the third source-drain pattern is electrically connected to the third bonding pattern, and the fourth source-drain pattern is electrically connected to the fourth bonding pattern. The first source-drain pattern and the third source-drain pattern are both electrically connected to the pixel driving circuit, and the second source-drain pattern and the fourth source-drain pattern are both electrically connected to the set voltage signal line.

In some embodiments, the first source-drain metal layer includes a first connection line, the first connection line is connected to the pixel driving circuit, and the first connection line is further connected to the first source-drain pattern and the third source-drain pattern.

In some embodiments, the first terminal and the third terminal are connected to a first connection node. The first connection line includes a connection portion located in a middle position of the first connection line, the connection portion serves as the first connection node, and the first source-drain pattern group and the second source-drain pattern group are both non-overlapping with the connection portion.

In some embodiments, the pixel driving circuit includes a driving transistor; the semiconductor layer includes an active layer of the driving transistor, and the first source-drain pattern group and the second source-drain pattern group are both non-overlapping with the active layer of the driving transistor.

In some embodiments, the pixel circuit further includes an electrostatic protection circuit, and the electrostatic protection circuit includes a first transistor and a second transistor. The semiconductor layer includes an active layer of the first transistor and an active layer of the second transistor, and a first end of the active layer of the first transistor and a second end of the active layer of the second transistor are close to and connected to each other. The first source-drain metal layer includes a first connection pattern, a second connection pattern, a third connection pattern and a second connection line. A second end of the active layer of the first transistor is connected to the first connection pattern, and the first connection pattern is further connected to a third voltage signal line; the third voltage signal line overlaps with the active layer of the first transistor. The first end of the active layer of the first transistor is further connected to the second connection pattern, and the second connection pattern is further connected to a gate pattern of the second transistor; the gate pattern of the second transistor overlaps with the active layer of the second transistor. A first end of the active layer of the second transistor is connected to the third connection pattern, and the third connection pattern is further connected to a fourth voltage signal line. Both ends of the second connection line are connected to the first connection line and the second connection pattern.

In some embodiments, the plurality of pixel circuits are arranged in an array. The first gate layer includes a plurality of third voltage signal lines and a plurality of fourth voltage signal lines extending along a row direction. Each third voltage signal line and each fourth voltage signal line are located in a region where a row of pixel circuits is located.

In some embodiments, the set voltage signal line is located in the first source-drain metal layer, and the set voltage signal line is a first voltage signal line. Alternatively, the set voltage signal line is located in the second source-drain metal layer, and the set voltage signal line is a second voltage signal line.

In yet another aspect, a display panel is provided. The display panel includes the array substrate as described in any of the above embodiments and a plurality of light-emitting devices. Each of the plurality of light-emitting devices is electrically connected to the first bonding terminal group or the second bonding terminal group in the array substrate.

In some embodiments, the light-emitting device is one of a micro organic light-emitting diode (micro OLED), a quantum dot light-emitting diode (QLED), a mini light-emitting diode (mini LED) or a micro light-emitting diode.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
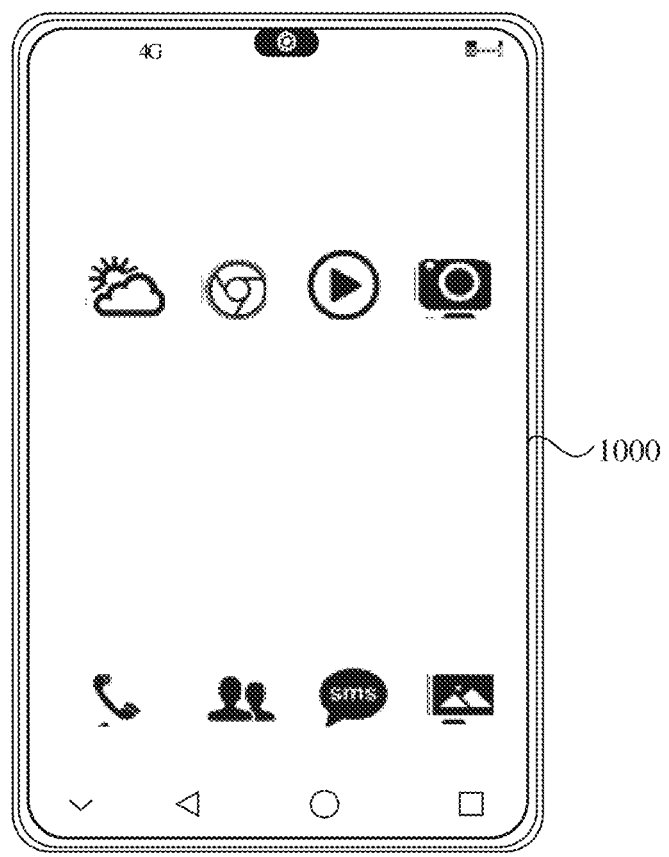
FIG. 1 is a structural diagram of a display apparatus, in accordance with some embodiments.

The technical solutions in some embodiments of the present disclosure will be described clearly and completely with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a/the plurality of" means two or more unless otherwise specified.

In the description of some embodiments, the expressions "coupled" and "connected" and derivatives thereof may be used. The term "connected" should be understood in a broad sense. For example, the term "connected" may represent a fixed connection, a detachable connection, or an integrated connection; alternatively, the term "connected" may represent a direct connection, or an indirect connection through an intermediate medium. The term "coupled" indicates, for example, that two or more components are in direct physical or electrical contact. The term "coupled" or "communicatively coupled" may also indicate that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", and they both include following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The phrase "applicable to" or "configured to" used herein means an open and inclusive expression, which does not exclude devices that are applicable to or configured to perform additional tasks or steps.

The term such as "about", "substantially" or "approximately" as used herein includes a stated value and an average value within an acceptable range of deviation of a particular value determined by a person of ordinary skilled in the art, considering measurement in question and errors associated with measurement of a particular quantity (i.e., limitations of a measurement system).

The term such as "parallel", "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

It should be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown as a rectangle shape generally has a curved feature. Therefore, the regions shown in the accompanying drawings are schematic in nature, and their shapes are not intended to show actual shapes of regions in a device, and are not intended to limit the scope of the exemplary embodiments.

Currently, in mini light-emitting diode (mini LED) display apparatuses and micro light-emitting diode (micro LED) display apparatuses, a large number of light-emitting devices are transferred by using a stamp method, but this transfer method may result in poor transfer, seriously affecting the quality of display products and reducing the reliability of display panels.

Based on this, some embodiments of the present disclosure provide a pixel circuit, an array substrate, a display panel and a display apparatus. The problem of poor transfer described above can be solved by adjusting an internal structure of the pixel circuit, thereby improving product yield and quality.

The pixel circuit, array substrate, display panel and display apparatus provided in the embodiments of the present disclosure are introduced below respectively.

Some embodiments of the present disclosure provide a display apparatus, and the display apparatus may be, for example, a mobile phone, a tablet computer, a personal digital assistant (PDA), a television, a vehicle-mounted computer, a wearable display apparatus, or the like. The embodiments of the present disclosure do not particularly limit a specific form of the display apparatus. For example, as shown in FIG. 1, the display apparatus 2000 is the mobile phone, and includes a display panel 1000.

Figure 2A:
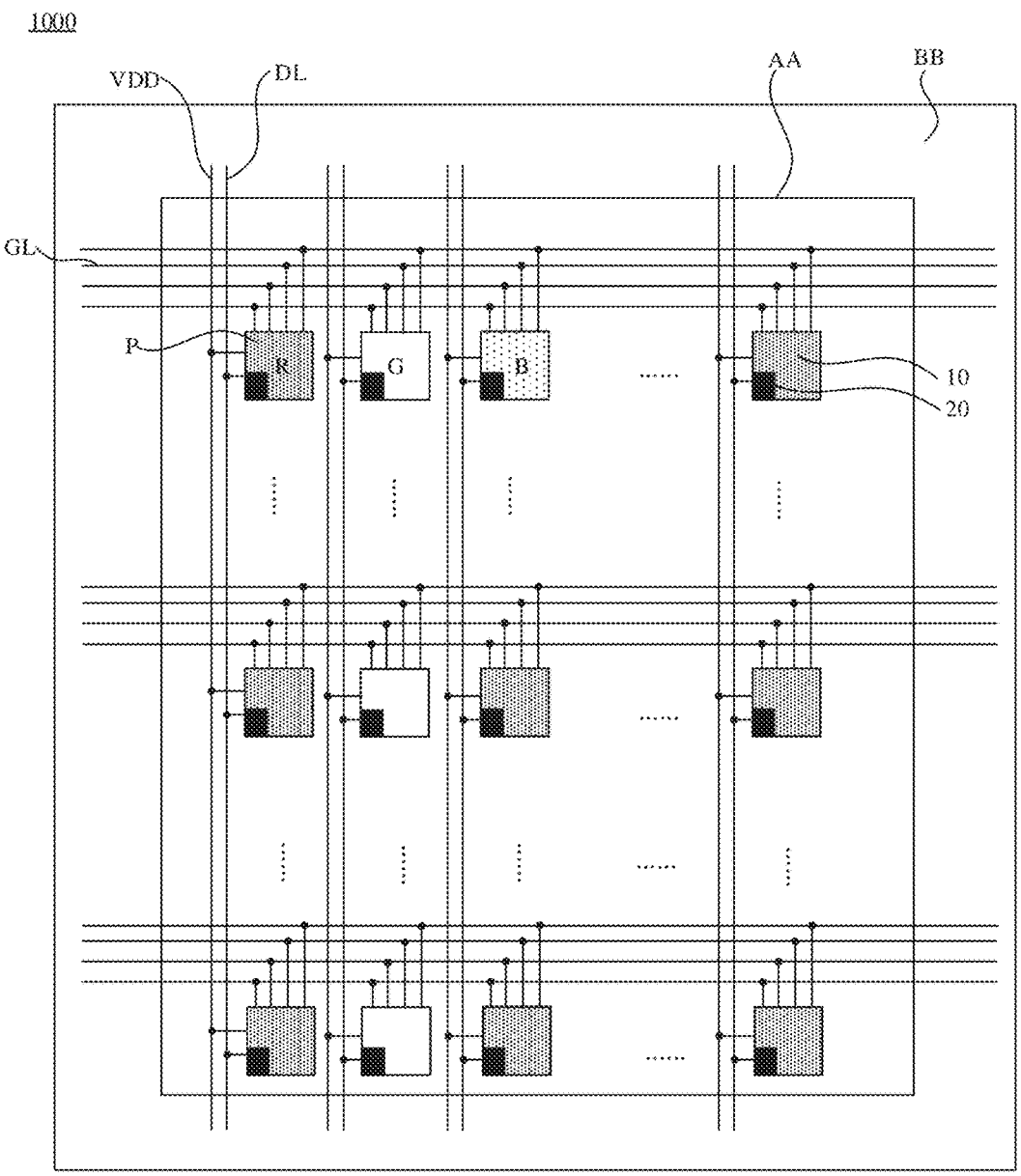
FIG. 2A is a structural diagram of a display panel, in accordance with some embodiments.

In some embodiments, as shown in FIG. 2A, the display panel 1000 includes a display area AA (also being referred as an active display area) and a peripheral area BB located on at least one side of the display area AA. The display area AA is provided therein with a plurality of sub-pixels P arranged in an array and a plurality of signal lines. The sub-pixel P is the smallest unit of the display panel 1000 for displaying an image. Each sub-pixel P is capable of displaying a single color, such as red (R), green (G) or blue (B). The brightnesses (gray scales) of sub-pixels P of different colors are adjusted. Multiple colors may be displayed through color combination and superposition, thereby achieving full-color display of the display panel 1000.

In some embodiments, the sub-pixel P includes a pixel circuit 10 and a light-emitting device 20 that are electrically connected. The pixel circuit is used for driving the light-emitting device 20 to emit light. The light-emitting device 20 may be a micro organic light-emitting diode (micro OLED), quantum dot light-emitting diode (QLED), mini light-emitting diode (mini LED) or micro light-emitting diode (micro LED).

Figure 2B:
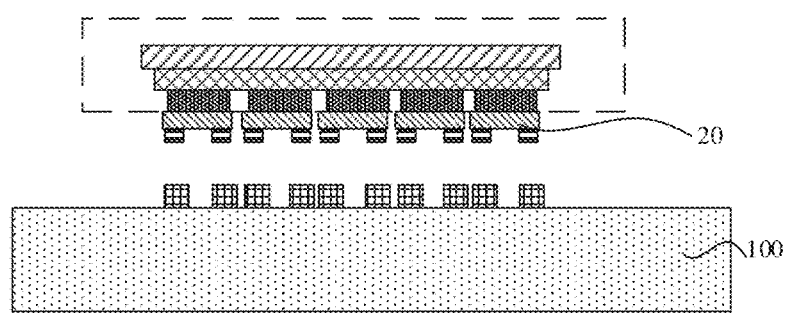
FIG. 2B is a structural diagram of bonding of light-emitting devices, in accordance with some embodiments.

The display panel 1000 includes an array substrate 100, and a plurality of pixel circuits 10 are disposed in the array substrate 100. In some embodiments, based on the mass transfer, light-emitting devices are transferred to the array substrate using a stamp method, and are connected to bonding terminals of the pixel circuits to achieve electrical connections between the light-emitting devices and the pixel circuits. As shown in FIG. 2B, bumps of the stamp are used to pick up light-emitting devices, and the light-emitting devices are transferred to corresponding positions on the array substrate. After positive and negative electrodes of the light-emitting devices are bonded to respective bonding terminals, the stamp is separated. During this process, poor transfer may occur on some light-emitting devices. For example, some light-emitting devices are missing, or some light-emitting devices themselves have poor structure, or due to position deviation of some light-emitting devices, their positive and negative electrodes are not overlapped with respective bonding terminals or their positive and negative electrodes are short-circuited. In this case, the light-emitting devices at corresponding positions cannot be lit normally, which affects the image display.

Figure 3A:
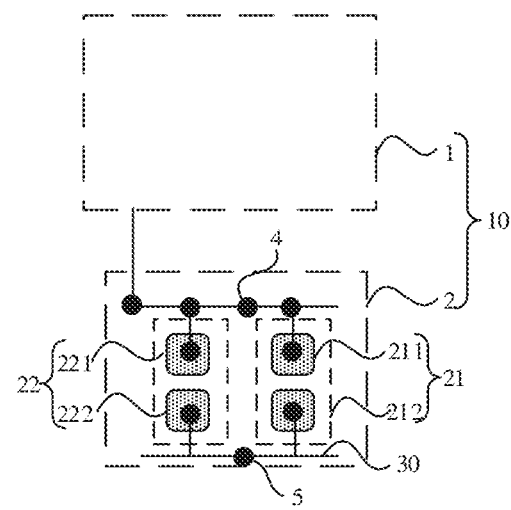
FIG. 3A is a structural diagram of a pixel circuit, in accordance with some embodiments.

A pixel circuit 10 provided in some embodiments of the present disclosure will be described below. As shown in FIG. 3A, the pixel circuit 10 includes a pixel driving circuit 1 and a bonding unit 2 connected to the pixel driving circuit 1. The bonding unit 2 includes a first bonding terminal group 21 and at least one second bonding terminal group 22 that are arranged in parallel. The first bonding terminal group 21 and the second bonding terminal group 22 are configured to bond light-emitting devices. The first bonding terminal group 21 includes a first terminal 211 and a second terminal 212, and the second bonding terminal group 22 includes a third terminal 221 and a fourth terminal 222. The first terminal 211 and the third terminal 221 are connected, and are both connected to the pixel driving circuit 1. The second terminal 212 and the fourth terminal 222 are connected, and are both connected to a set voltage signal line 30.

It should be noted that the two electrodes of the light-emitting device are respectively connected to the first terminal 211 and the second terminal 212 in the first bonding terminal group 21, and the two electrodes of the light-emitting device are respectively connected to the third terminal 221 and the fourth terminal 222 of the second bonding terminal group 22. In addition, there is no limitation on which terminal the positive electrode or the negative electrode of the light-emitting device is bonded to, and it is determined based on the specific connection relationship between the pixel circuit and the voltage signal line.

The set voltage signal line 30 can transmit a set voltage signal, and the set voltage is a constant voltage. The set voltage signal line can be a high-level signal line or a low-level signal line.

The pixel driving circuit is able to output a driving current for driving the light-emitting device to emit light.

For example, referring to FIG. 3A, the bonding unit 2 includes the first bonding terminal group 21 and the second bonding terminal group 22 arranged in parallel, and the first bonding terminal group 21 and the second bonding terminal group 22 are both connected to the pixel driving circuit 1 and the set voltage signal line 30 and configured to bond the light-emitting device. In a process of transferring the light-emitting device, if a fault occurs during the bonding of the light-emitting device to the first bonding terminal group 21, causing the light-emitting device at the position of the first bonding terminal group 21 to be unable to be lit, a second transfer is performed at the second bonding terminal group 22, and the second bonding terminal group 22 is used as a backup bonding terminal group to complete the bonding of the light-emitting device. Thus, the light-emitting device at the position of the second bonding terminal group is lit normally, thereby reducing the defective rate during the mass transfer of light-emitting devices, increasing the lighting rate of the light-emitting devices, and improving the quality of display products. There is no limitation on the number of the second bonding terminal group(s) 22 here.

In some examples, the first terminal 211 and the third terminal 221 are connected to a first connection node 4, and the second terminal 212 and the fourth terminal 222 are connected to a second connection node 5. In the case where the light-emitting device at the position of the first bonding terminal group 21 fails and cannot be lit, connection leads at the first connection node 4 and the second connection node 5 can be cut off to isolate the first bonding terminal group 21 from the pixel driving circuit. The light-emitting device at the position of first bonding terminal group 21 does not work, which prevents the abnormal emission of the light-emitting device from affecting the image display, or the short circuit between the positive and negative electrodes of the light-emitting device from affecting the pixel circuit. Thus, it ensures that the light-emitting device at the position of the second bonding terminal group 22 can emit light normally and improves the lighting rate of the light-emitting devices of the display panel.

In the display panel, a first voltage signal line VDD and a second voltage signal line VSS are generally included. The first voltage signal line VDD is configured to transmit a first voltage signal, and the second voltage signal line VSS is configured to transmit a second voltage signal. A voltage of the first voltage signal is greater than a voltage of the second voltage signal. There is a voltage difference between the positive and negative electrodes of the light-emitting device, so that a current can flow through the light-emitting device and the light-emitting device can emit light. Based on this principle, the following provides examples of different connection manners between the pixel circuit 10 and the voltage signal lines.

Figure 3B:
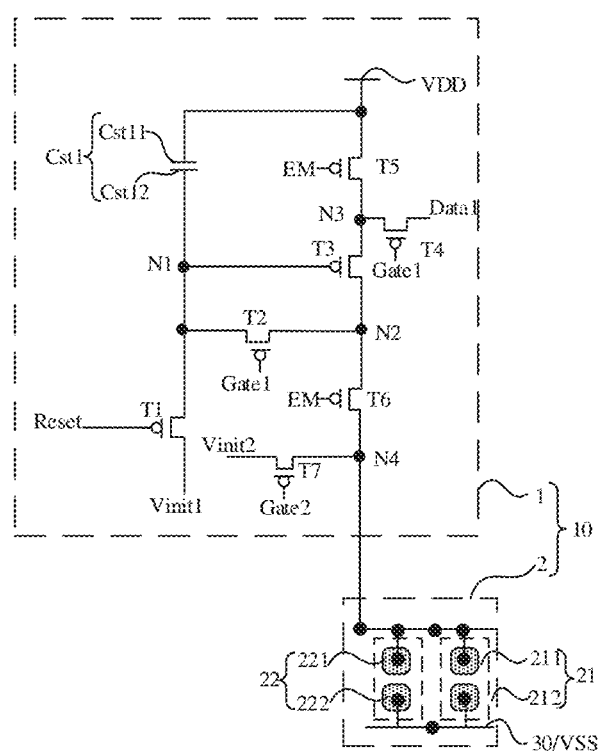
FIG. 3B is a structural diagram of another pixel circuit, in accordance with some embodiments.

In some embodiments, referring to FIG. 3B, the pixel driving circuit 1 is electrically connected to the first voltage signal line VDD, and the set voltage signal line 30 is the second voltage signal line VSS.

For example, the set voltage signal line 30 is the second voltage signal line VSS, which means that the second terminal 212 and the fourth terminal 222 of the bonding unit 2 are connected to the second voltage signal line VSS. That is, the second terminal 212 and the fourth terminal 222 receive the second voltage signal. A terminal of the pixel driving circuit 1 is connected to the first voltage signal line VDD, and another terminal of the pixel driving circuit 1 is connected to the first terminal 211 and the third terminal 221 of the bonding unit 2. The first terminal 211 and the third terminal 221 are configured to bond positive electrodes of respective light-emitting devices, and the second terminal 212 and the fourth terminal 222 are configured to bond negative electrodes of the respective light-emitting devices. In this way, the positive electrode of the light-emitting device is indirectly electrically connected to the first voltage signal line VDD through the pixel driving circuit, and the negative electrode of the light-emitting device is electrically connected to the second voltage signal line VSS. Thus, the light-emitting device can emit light under the driving of the pixel driving circuit.

Figure 3C:
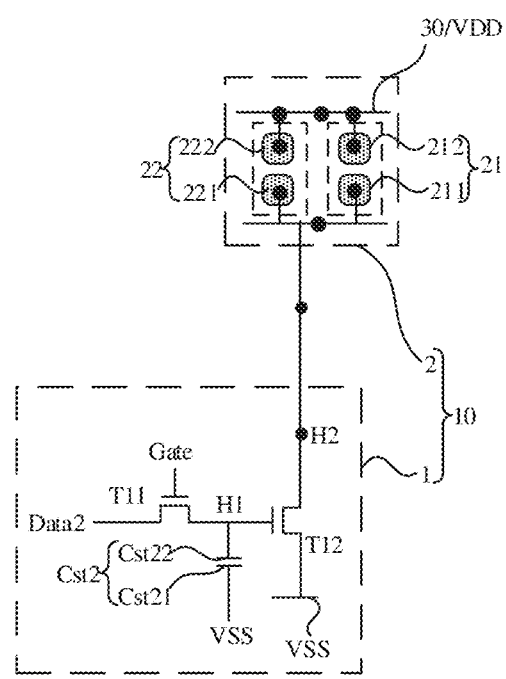
FIG. 3C is a structural diagram of yet another pixel circuit, in accordance with some embodiments.

In some embodiments, as shown in FIG. 3C, the pixel driving circuit 1 is electrically connected to the second voltage signal line VSS, and the set voltage signal line is the first voltage signal line VDD.

For example, the set voltage signal line 30 is the first voltage signal line VDD, which means that the second terminal 212 and the fourth terminal 222 of the bonding unit 2 are connected to the first voltage signal line VDD. That is, the second terminal 212 and the fourth terminal 222 receives the first voltage signal. A terminal of the pixel driving circuit 1 is electrically connected to the second voltage signal line VSS, and another terminal of the pixel driving circuit 1 is connected to the first terminal 211 and the third terminal 221 of the bonding unit 2. The first terminal 211 and the third terminal 221 are configured to bond negative electrodes of respective light-emitting devices, and the second terminal 212 and the fourth terminal 222 are configured to bond positive electrodes of the respective light-emitting devices. In this way, the positive electrode of the light-emitting device is electrically connected to the first voltage signal line VDD, and the negative electrode of the light-emitting device is indirectly electrically connected to the second voltage signal line VSS through the pixel driving circuit. Thus, the light-emitting device can emit light under the driving of the pixel driving circuit.

In some embodiments, the pixel driving circuit 1 may be a "2T1C" circuit, a "7T1C" circuit, a "8T1C" circuit, a "9T1C" circuit, or the like, where "T" is represented as a transistor, the number in front of "T" is represented as the number of transistors, "C" is represented as a capacitor, and the number in front of "C" is represented as the number of capacitors. For example, "7T1C" is represented as 7 transistors and 1 capacitor.

The following describes the structure of the corresponding pixel driving circuit 1 in the case where the set voltage signal line 30 is the second voltage signal line VSS, and the pixel driving circuit 1 is only one of examples.

In some embodiments, the structure of the pixel driving circuit 1 shown in FIG. 3B is introduced, and the pixel driving circuit 1 is an equivalent circuit of the pixel driving circuit 1 with 7T1C. The pixel driving circuit 1 with 7T1C may include: a first reset transistor T1, a compensation transistor T2, a driving transistor T3, a writing transistor T4, a first light-emitting control transistor T5, a second light-emitting control transistor T6, a second reset transistor T7 and a first capacitor Cst1. The signal lines electrically connected to the pixel driving circuit 1 include a reset signal line Reset, a first scan signal line Gate1, a second scan signal line Gate2, a first data signal line Data1, a light-emitting control signal line EM, a first initialization signal line Vinit1 and a second initialization signal line Vinit2.

For example, as shown in FIG. 3B, a gate of the first reset transistor T1 is electrically connected to the reset signal line Reset, a first electrode of the first reset transistor T1 is electrically connected to a first node N1, and a second electrode of the first reset transistor T1 is electrically connected to the first initialization signal line Vinit1. The first reset transistor T1 is configured to reset the first node N1 in response to a reset signal received at the reset signal line Reset.

A gate of the compensation transistor T2 is electrically connected to the first scan signal line Gate1, a first electrode of the compensation transistor T2 is electrically connected to the first node N1, and a second electrode of the compensation transistor T2 is electrically connected to a second node N2. The compensation transistor T2 is configured to perform threshold compensation on the driving transistor T3 in response to a scan signal received at the first scan signal line Gate1.

A gate of the driving transistor T3 is electrically connected to the first node N1, a first electrode of the driving transistor T3 is electrically connected to a third node N3, and a second electrode of the driving transistor T3 is electrically connected to the second node N2. The driving transistor T3 is configured to generate a driving current signal.

A gate of the writing transistor T4 is electrically connected to the first scan signal line Gate1, a first electrode of the writing transistor T4 is electrically connected to the third node N3, and a second electrode of the writing transistor T4 is electrically connected to the first data signal line Data1. The writing transistor T4 is configured to transmit a data signal received at the first data signal line Data1 to the driving transistor T3 in response to the scan signal received at the first scan signal line Gate1.

A gate of the first light-emitting control transistor T5 is electrically connected to the light-emitting control signal line EM, a first electrode of the first light-emitting control transistor T5 is electrically connected to the first voltage signal line VDD, and a second electrode of the first light-emitting control transistor T5 is electrically connected to the third node N3. The first light-emitting control transistor T5 is configured to transmit a power supply signal received at the first voltage signal line VDD to the driving transistor T3 in response to a light-emitting control signal received at the light-emitting control signal line EM.

A gate of the second light-emitting control transistor T6 is electrically connected to the light-emitting control signal line EM, a first electrode of the second light-emitting control transistor T6 is electrically connected to the second node N2, and a second electrode of the second light-emitting control transistor T6 is electrically connected to a fourth node N4. The second light-emitting control transistor T6 is configured to, in response to the light-emitting control signal received at the light-emitting control signal line EM, transmit the driving current signal to the light-emitting device for driving the light-emitting device to emit light.

A gate of the second reset transistor T7 is electrically connected to the second scan signal line Gate2, a first electrode of the second reset transistor T7 is electrically connected to the second initialization signal line Vinit2, and a second electrode of the second reset transistor T7 is electrically connected to the fourth node N4. The second reset transistor T7 is configured to, in response to a scan signal received at the second scan signal line Gate2, transmit an initial signal received at the second initialization signal line Vinit2 to the light-emitting device, so as to reset the light-emitting device.

For example, as shown in FIG. 3B, the first capacitor Cst1 includes a first electrode plate Cst11 and a second electrode plate Cst12. The first electrode plate Cst11 is electrically connected to the first voltage signal line VDD, and the second electrode plate Cst12 is electrically connected to the first node N1.

The first voltage signal line VDD in the pixel driving circuit 1 described above is used to transmit the first voltage signal, e.g., a high-voltage direct current signal.

For example, the fourth node N4 of the pixel driving circuit 1 is electrically connected to the first terminal 211 and the third terminal 221 of the bonding unit 2, and the first terminal 211 and the third terminal 221 are configured to bond the positive electrodes of respective light-emitting devices. The second terminal 212 and the fourth terminal 222 are connected to the second voltage signal line VSS, and the second terminal 212 and the fourth terminal 222 are configured to bond the negative electrodes of the respective light-emitting device.

The following describes the structure of the corresponding pixel driving circuit 1 in the case where the set voltage signal line 30 is the first voltage signal line VDD, and the pixel driving circuit 1 is only one of examples.

In some embodiments, the structure of the pixel driving circuit 1 shown in FIG. 3C is introduced, and the pixel driving circuit 1 is an equivalent circuit of the pixel driving circuit 1 with 2T1C. The pixel driving circuit 1 with 2T1C may specifically include: a data writing transistor T11, a current driving transistor T12, a second capacitor Cst2, a scan signal line Gate and a second data signal line Data2.

For example, as shown in FIG. 3C, a gate of the data writing transistor T11 is electrically connected to the scan signal line Gate, a first electrode of the data writing transistor T11 is electrically connected to the second data signal line Data2, and a second electrode of the data writing transistor T11 is electrically connected to a fifth node H1. The second capacitor Cst2 includes a first electrode plate Cst21 and a second electrode plate Cst22. The first electrode plate Cst21 is electrically connected to the second voltage signal line VSS, and the second electrode plate Cst22 is electrically connected to the fifth node H1. A gate of the current driving transistor T12 is electrically connected to the fifth node H1, a first electrode of the current driving transistor T12 is electrically connected to a sixth node H2, and a second electrode of the current driving transistor T12 is electrically connected to the second voltage signal line VSS.

The second voltage signal line VSS in the pixel driving circuit 1 described above is used to transmit the second voltage signal, e.g., a low-voltage direct current signal.

For example, the sixth node H2 of the pixel driving circuit 1 is electrically connected to the first terminal 211 and the third terminal 221 of the bonding unit 2, and the first terminal 211 and the third terminal 221 are configured to bond the negative electrodes of respective light-emitting devices. The second terminal 212 and the fourth terminal 222 are connected to the first voltage signal line VDD, and the second terminal 212 and the fourth terminal 222 are configured to bond the positive electrodes of the respective light-emitting device.

It should be noted that, in the embodiments of the present disclosure, the first electrode of the transistor is one of a source and a drain of the transistor, and the second electrode of the transistor is the other of the source and the drain of the transistor. Since the source and the drain of the transistor may be symmetrical in structure, the source and the drain thereof may be indistinguishable in structure. That is, the first electrode and the second electrode of the transistor in the embodiments of the present disclosure may be indistinguishable in structure. For example, in a case where the transistor is a P-type transistor, the first electrode of the transistor is the source, and the second electrode of the transistor is the drain. As another example, in a case where the transistor is an N-type transistor, the first electrode of the transistor is the drain, and the second electrode of the transistor is the source.

In the circuit provided in the embodiments of the present disclosure, nodes do not represent actual components, but represent junctions of relevant electrical connections in a circuit diagram. That is, these nodes are nodes equivalent to junctions of relevant electrical connections in the circuit diagram.

Figure 4:
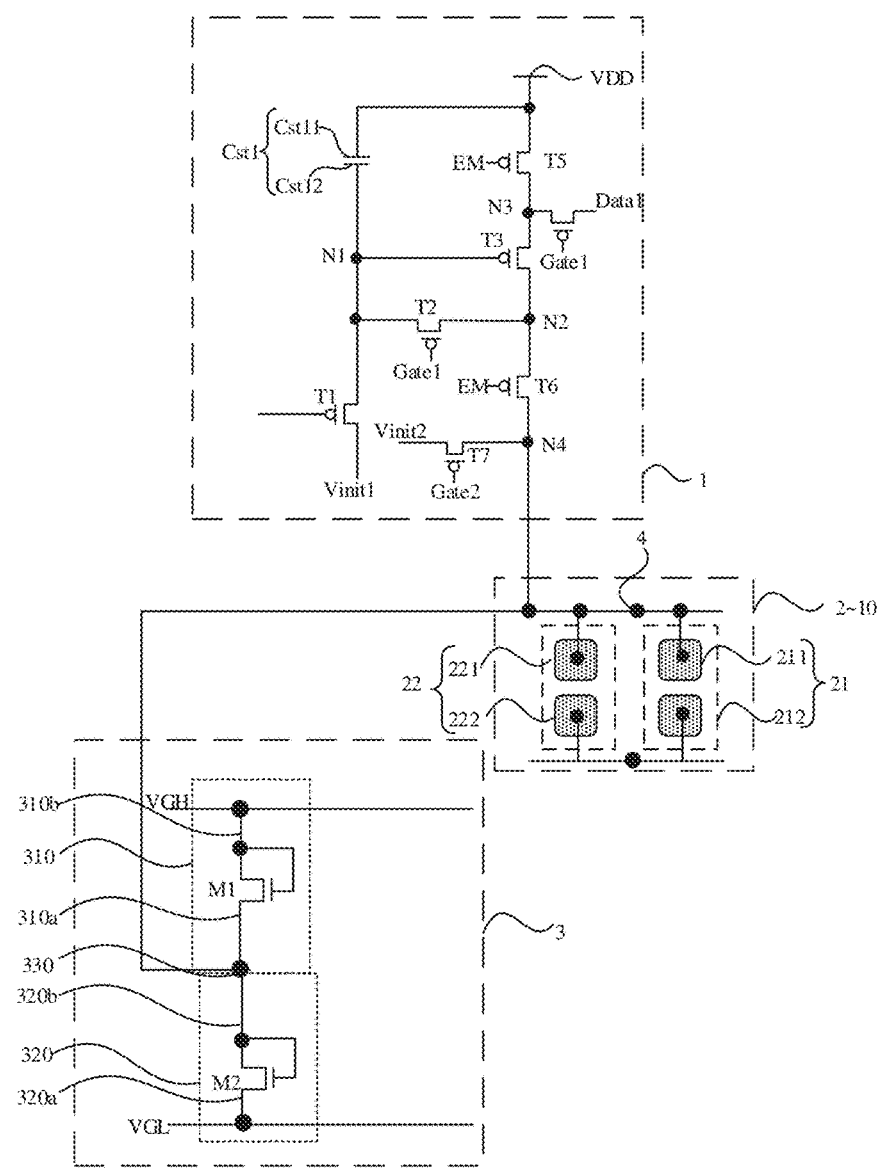
FIG. 4 is a structural diagram of yet another pixel circuit, in accordance with some embodiments.

Referring to FIG. 4, the pixel circuit 10 further includes an electrostatic protection circuit 3. The first terminal 211 and the third terminal 221 are connected to the first connection node 4, and the electrostatic protection circuit 3 is electrically connected to the first connection node 4.

The electrostatic protection circuit 3 includes a first electrostatic protection circuit 31, and the first electrostatic protection circuit 31 includes a first sub-circuit 310 and a second sub-circuit 320. A first terminal 310a of the first sub-circuit 310 and a second terminal 320b of the second sub-circuit 320 are electrically connected to a first connection point 330. A second terminal 310b of the first sub-circuit 310 is electrically connected to a third voltage signal line VGH, and a first terminal 320a of the second sub-circuit 320 is electrically connected to a fourth voltage signal line VGL. The third voltage signal line VGH is configured to transmit a third voltage signal, and the fourth voltage signal line VGL is configured to transmit a fourth voltage signal. A voltage of the third voltage signal is greater than a voltage of the fourth voltage signal.

The first sub-circuit 310 is configured to be turned on when an abnormal high voltage occurs at the first connection node 4, so that the first connection point 330 discharges to the third voltage signal line VGH. The second sub-circuit 320 is configured to be turned on when an abnormal low voltage occurs at the first connection node 4, so that the fourth voltage signal line VGL charges the first connection point 330.

It should be noted that, the abnormal high voltage means that during the transfer process of the light-emitting device, the voltage at the first connection node 4 is higher than the voltage of the third voltage signal transmitted by the third voltage signal line VGH. In this case, the first sub-circuit 310 is turned on by the abnormal high voltage, and the abnormal high voltage discharges to the third voltage signal line VGH, so that the voltage at the first connection node 4 gradually decreases until the voltage at the first connection point 330 is equal to the voltage transmitted by the third voltage signal line VGH; the abnormal low voltage means that during the transfer process of the light-emitting device, the voltage at the first connection node 4 is lower than the voltage of the fourth voltage signal transmitted by the fourth voltage signal line VGL. In this case, the second sub-circuit 320 is turned on by the abnormal low voltage, so that the fourth voltage signal line VGL charges the first connection point 330, and the voltage at the first connection node 4 gradually increases until the voltage at the first connection node 4 is equal to the voltage transmitted by the fourth voltage signal line VGL. Thus, it ensures that the voltage at the first connection node 4 is within a normal range, achieving the effect of electrostatic discharge.

For example, during the transfer process of the light-emitting devices (for example, the stamp method is used to transfer the light-emitting devices), when the stamp contacts and separates from the array substrate, static electricity is easily generated and electrostatic discharge is poor. The static electricity will cause breakdown or damage to electronic components of the display panel (e.g., the abnormal high voltage or abnormal low voltage mentioned above will cause electrostatic breakdown or damage to the light-emitting device, affecting the quality of the display products. By arranging the electrostatic protection circuit 3, electrostatic transfer or release can be induced, thereby effectively solving the breakdown problem caused by electrostatic accumulation, and improving the yield and quality of the products.

In some examples, the third voltage signal line VGH and the fourth voltage signal line VGL are distributed in the entire display area of the display panel. Thus, an abnormally high voltage at a bonding terminal can discharge to the third voltage signal line VGH in the entire display area, or an abnormal low voltage at a bonding terminal can be charged through the fourth voltage signal line VGL in the entire display area, which can achieve rapid charging and discharging and solve the problem of poor electrostatic discharge more efficiently.

It should be noted that, during the mass transfer of light-emitting devices, the third voltage signal line and the fourth voltage signal line need to be loaded with corresponding voltages to ensure the normal operation of the electrostatic protection circuit. For example, bonding points of the third voltage signal line VGH and the fourth voltage signal line VGL may be provided on the array substrate. For example, the bonding points are provided in the peripheral area of the array substrate. The bonding point of the third voltage signal line VGH is electrically connected to the third voltage signal line VGH, and the bonding point of the fourth voltage signal line VGL is electrically connected to the fourth voltage signal line VGL. For example, a voltage output device is electrically connected to the bonding points of the third voltage signal line VGH and the fourth voltage signal line VGL, and outputs corresponding signals (the third voltage signal and the fourth voltage signal), thereby transmitting the signals to the third voltage signal line VGH and the fourth voltage signal line VGL respectively. Thus, the static electricity generated during the mass transfer of the light-emitting devices can be released through the third voltage signal line VGH and the fourth voltage signal line VGL.

Several examples of first sub-circuits including at least one first transistor are provided below.

Figure 5A:
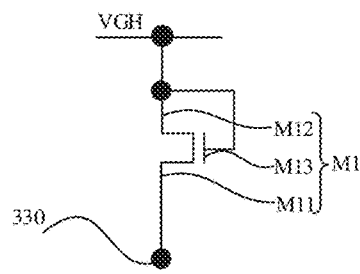
FIG. 5A is a structural diagram of connection of a first sub-circuit, in accordance with some embodiments.

In some embodiments, referring to FIG. 5A, the first sub-circuit 310 includes a first transistor M1. A gate M13 of the first transistor M1 is electrically connected to a second electrode M12 of the first transistor M1, a first electrode M11 of the first transistor M1 is electrically connected to the first connection point 330, and the second electrode M12 of the first transistor M1 is electrically connected to the third voltage signal line VGH.

In the case where the gate M13 of the first transistor M1 is electrically connected to the second electrode M12 of the first transistor M1, the first transistor M1 may be equivalent to a diode. The first transistor M1 is electrically connected between the first connection point 330 and the third voltage signal line VGH. According to the one-way conduction performance of the diode, when the voltage V330 of the first connection point 330 is higher than the voltage Vgh of the third voltage signal line VGH, and the difference between the voltage V330 of the first connection point 330 and the voltage Vgh of the third voltage signal line VGH is greater than or equal to a certain voltage value Vf, (i.e., V330−Vgh≥Vf), the first transistor M1 is turned on. That is to say, the abnormal high voltage at the first connection node 4 turns on the first transistor M1. The first connection point 330 gradually discharges to the third voltage signal line VGH, and the potential of the first connection point 330 gradually decreases, so that the voltage at the first connection node 4 gradually decreases. When the voltage at the first connection node 4 decreases to a value less than the sum of the voltage Vgh of the third voltage signal line VGH and the voltage Vf (i.e., V330<Vgh+Vf), the first transistor M1 does not meet the conduction condition, and the first transistor M1 is turned off.

Figure 5B:
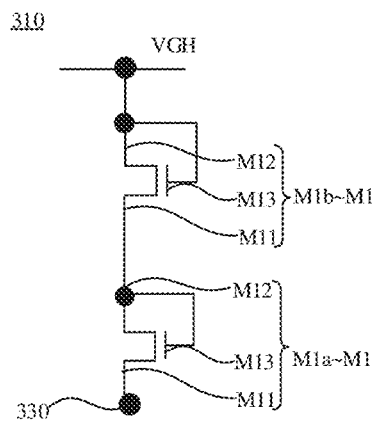
FIG. 5B is a structural diagram of connection of another first sub-circuit, in accordance with some embodiments.
Figure 5C:
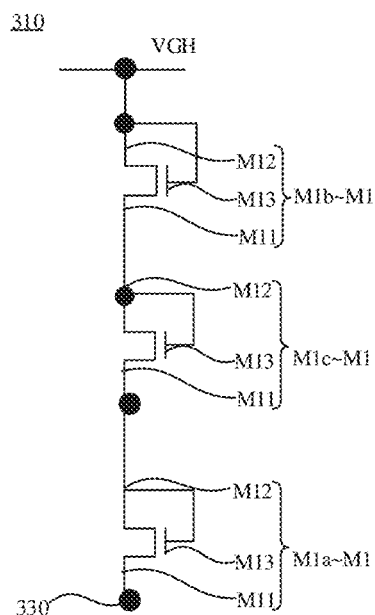
FIG. 5C is a structural diagram of connection of yet another first sub-circuit, in accordance with some embodiments.

In some embodiments, referring to FIGS. 5B and 5C, the first sub-circuit 310 includes at least two first transistors M1 connected in series. The gate M13 of each first transistor M1 is electrically connected to the second electrode M12 thereof, the first electrode M11 of a first transistor M1a in the at least two first transistors M1 is electrically connected to the first connection point 330, and the second electrode M12 of a last first transistor M1b in the at least two first transistors M1 is electrically connected to the third voltage signal line VGH.

For example, as shown in FIG. 5B, the first sub-circuit 310 shown in FIG. 5B includes two first transistors M1 connected in series. The gate M13 of each first transistor M1 is electrically connected to the second electrode M12 thereof, and the two first transistors M1 arranged from bottom to top in FIG. 5B are referred to as the first transistor M1a and the last first transistor M1b in sequence. The first electrode M11 of the first transistor M1a is electrically connected to the first connection point 330, the second electrode M12 of the last first transistor M1b is electrically connected to the third voltage signal line VGH, and the second electrode M12 of the first transistor M1a is electrically connected to the first electrode M11 of the last first transistor M1b. As for the conduction principle of the two first transistors M1 involved in the first sub-circuit 310, reference is made to the above description of the first transistor M1 being equivalent to the diode, which will not be repeated here.

For example, as shown in FIG. 5C, the first sub-circuit 310 shown in FIG. 5C includes three first transistors M1 connected in series. The gate M13 of each first transistor M1 is electrically connected to the second electrode M12 thereof, and the three first transistors M1 arranged from bottom to top in FIG. 5C are referred to as the first transistor M1a, a second first transistor M1c and the last first transistor M1b in sequence. The first electrode M11 of the first transistor M1a is electrically connected to the first connection point 330, and the second electrode M12 of the last first transistor M1b is electrically connected to the third voltage signal line VGH. The second electrode M12 of the first transistor M1a is electrically connected to the first electrode M11 of the second first transistor M1c, and the second electrode M12 of the second first transistor M1c is electrically connected to the first electrode M11 of the last first transistor M1b. As for the conduction principle of the three first transistors M1 involved in the first sub-circuit 310, reference is made to the above description of the first transistor M1 being equivalent to the diode, which will not be repeated here.

The first sub-circuit 310 includes at least two first transistors M1 connected in series, which can improve the discharging efficiency of the first connection point 330 to the third voltage signal line VGH, achieve rapid discharging, and further improve the electrostatic protection effect.

Several examples of second sub-circuits including at least one second transistor are provided below.

Figure 6A:
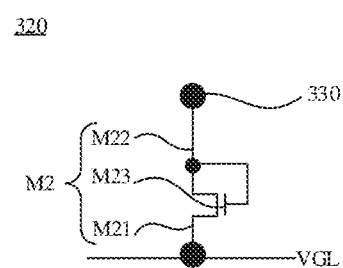
FIG. 6A is a structural diagram of connection of a second sub-circuit, in accordance with some embodiments.

In some embodiments, as shown in FIG. 6A, the second sub-circuit 320 includes a second transistor M2. A gate M23 of the second transistor M2 is electrically connected to a second electrode M22 of the second transistor M2, a first electrode M21 of the second transistor M2 is electrically connected to the fourth voltage signal line VGL, and the second electrode M22 of the second transistor M2 is electrically connected to the first connection point 330.

In the case where the gate M23 of the second transistor M2 is electrically connected to the second electrode M22 of the second transistor M2, the second transistor M2 may be equivalent to a diode. The second transistor M2 is electrically connected between the first connection point 330 and the fourth voltage signal line VGL. According to the one-way conduction performance of the diode, when the voltage V330 of the first connection point 330 is lower than the voltage Vg1 of the fourth voltage signal line VGL, and the difference between the voltage Vg1 of the fourth voltage signal line VGL and the voltage V330 of the first connection point 330 is greater than or equal to a certain voltage value Vf, (i.e., Vg1−V330≥Vf), the second transistor M2 is turned on. That is to say, the abnormal low voltage at the first connection node 4 turns on the second transistor M2. The first connection point 330 is gradually charged by the fourth voltage signal line VGL, and the potential of the first connection point 330 gradually increases, so that the voltage at the first connection node 4 gradually increases. When the voltage at the first connection node 4 increases to a value greater than the difference between the voltage Vg1 of the fourth voltage signal line VGL and the voltage Vf (i.e., V330>Vg1−Vf), the second transistor M2 does not meet the conduction condition, and the second transistor M2 is turned off.

Figure 6B:
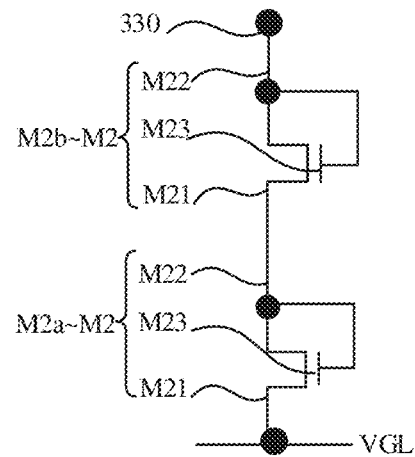
FIG. 6B is a structural diagram of connection of another second sub-circuit, in accordance with some embodiments.
Figure 6C:
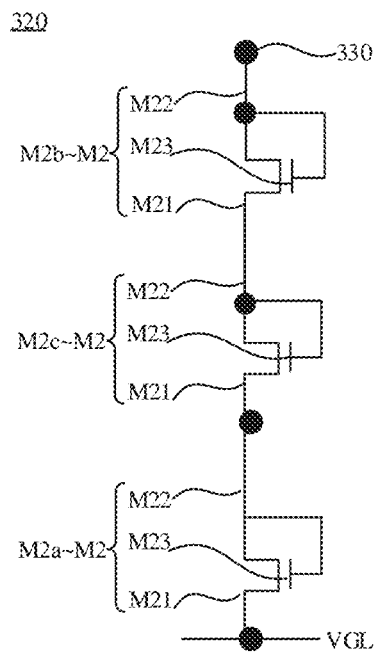
FIG. 6C is a structural diagram of connection of yet another second sub-circuit, in accordance with some embodiments.

In some embodiments, as shown in FIGS. 6B and 6C, the second sub-circuit 320 includes at least two second transistors M2 connected in series. The gate M23 of each second transistor M2 is electrically connected to the second electrode M22 thereof, the first electrode M21 of a first second transistor M2a in the at least two second transistors M2 is electrically connected to the fourth voltage signal line VGL, and the second electrode M22 of a last second transistor M2b in the at least two second transistors M2 is electrically connected to the first connection point 330.

For example, referring to FIG. 6B, the second sub-circuit 320 shown in FIG. 6B includes two second transistors M2 connected in series. The gate M23 of each second transistor M2 is electrically connected to the second electrode M22 thereof, and the two second transistors M2 arranged from bottom to top in FIG. 6B are referred to as the first second transistor M2a and the last second transistor M2b in sequence. The first electrode M21 of the first second transistor M2a is electrically connected to the fourth voltage signal line VGL, the second electrode M22 of the last second transistor M2b is electrically connected to the first connection point 330, and the second electrode M22 of the first second transistor M2a is electrically connected to the first electrode M21 of the last second transistor M2b. As for the conduction principle of the two second transistors M2 connected in series involved in the second sub-circuit 320, reference is made to the above description of the second transistor M2 being equivalent to the diode, which will not be repeated here.

For example, as shown in FIG. 6C, the second sub-circuit 320 shown in FIG. 6C includes three second transistors M2 connected in series. The gate M23 of each second transistor M2 is electrically connected to the second electrode M22 thereof, and the three second transistors M2 arranged from bottom to top in FIG. 6C are referred to as the first second transistor M2a, a second transistor M2c and the last second transistor M2b in sequence. The first electrode M21 of the first second transistor M2a is electrically connected to the fourth voltage signal line VGL, and the second electrode M22 of the last second transistor M2b is electrically connected to the first connection point 330. The second electrode M22 of the first second transistor M2a is electrically connected to the first electrode M21 of the second transistor M2c, and the second electrode M22 of the second transistor M2c is electrically connected to the first electrode M21 of the last second transistor M2b. As for the conduction principle of the three second transistors M2 connected in series involved in the second sub-circuit 320, reference is made to the above description of the second transistor M2 being equivalent to the diode, which will not be repeated here.

The second sub-circuit 320 includes at least two second transistors M2 connected in series, which can improve the charging efficiency of the fourth voltage signal line VGL to the first connection point 330, achieve rapid charging, and further improve the electrostatic protection effect.

Figure 7:
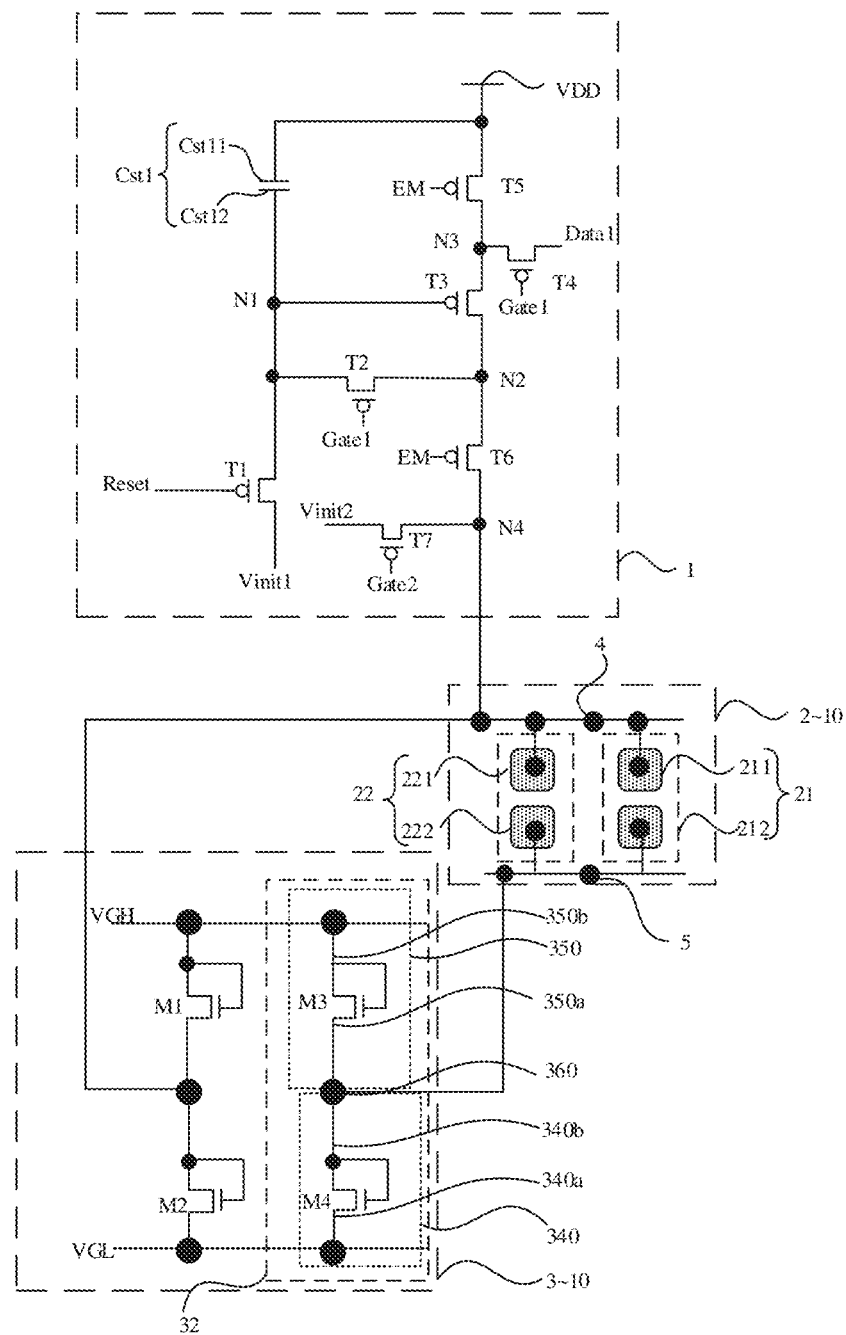
FIG. 7 is a structural diagram of yet another pixel circuit, in accordance with some embodiments.

In some embodiments, referring to FIG. 7, the second terminal 212 and the fourth terminal 222 are connected to the second connection node 5, and the electrostatic protection circuit 3 is electrically connected to the second connection node 5. The electrostatic protection circuit 3 further includes a second electrostatic protection circuit 32. The second electrostatic protection circuit 32 includes a third sub-circuit 350 and a fourth sub-circuit 340. A first terminal 350a of the third sub-circuit 350 and a second terminal 340b of the fourth sub-circuit 340 are electrically connected to a second connection point 360. A second terminal 350b of the third sub-circuit 350 is electrically connected to the third voltage signal line VGH. A first terminal 340a of the fourth sub-circuit 340 is electrically connected to the fourth voltage signal line VGL. The third sub-circuit 350 is configured to be turned on when an abnormal high voltage occurs at the second connection node 5, so that the second connection point 360 discharges to the third voltage signal line VGH. The fourth sub-circuit 340 is configured to be turned on when an abnormal low voltage occurs at the second connection node 5, so that the fourth voltage signal line VGL charges the second connection node 5.

It should be noted that, the abnormal high voltage means that during the transfer process of the light-emitting device, the voltage at the second connection node 5 is higher than the voltage of the third voltage signal transmitted by the third voltage signal line VGH. In this case, the third sub-circuit 350 is turned on by the abnormal high voltage, and the abnormal high voltage discharges to the third voltage signal line VGH, so that the voltage at the second connection node 5 gradually decreases until the voltage at the second connection point 360 decreases to a value equal to the sum of the voltage Vgh transmitted by the third voltage signal line VGH and the voltage Vf; the abnormal low voltage means that during the transfer process of the light-emitting device, the voltage at the second connection node 5 is lower than the voltage of the fourth voltage signal transmitted by the fourth voltage signal line VGL. In this case, the fourth sub-circuit 340 is turned on by the abnormal low voltage, so that the fourth voltage signal line VGL charges the second connection point 360, and the voltage at the second connection node 5 gradually increases until the voltage at the second connection node 5 increases to a value equal to the difference between the voltage Vg1 transmitted by the fourth voltage signal line VGL and the voltage Vf. Thus, it can be found that when there is the electrostatic protection circuit 3, it can be ensured that the voltage at the second connection node 5 is in a range of (Vg1−Vf) to (Vgh+Vf), achieving the electrostatic discharge effect.

For example, referring to FIG. 3B, in the case where the set voltage signal line 30 is the second voltage signal line VSS, the second terminal 212 and the fourth terminal 222 of the bonding unit 2 are connected to the second voltage signal line VSS, and receive the second voltage signal. The second terminal 212 and the fourth terminal 222 are bonded to the negative electrodes of the light-emitting devices. That is, the negative electrodes of the light-emitting devices are connected to the second voltage signal line VSS. In general, the second voltage signal is a direct current signal, and the signal can distribute over the entire display area. When an abnormal voltage occurs during the transfer process of the light-emitting device, the abnormal voltage can be transferred directly on the second voltage signal, so that the static electricity generated during the transfer can be gradually eliminated. In this case, it is also possible to transfer or release the static electricity without arranging the second electrostatic protection circuit 32, effectively solving the problem of electrostatic breakdown, and improving the yield and quality of products. In addition, due to the absence of the second electrostatic protection circuit 32, the space layout of the pixel circuit can be saved, and thus the display panel has higher pixel density and resolution.

Several examples of third sub-circuits including at least one third transistor are provided below.

Figure 8A:
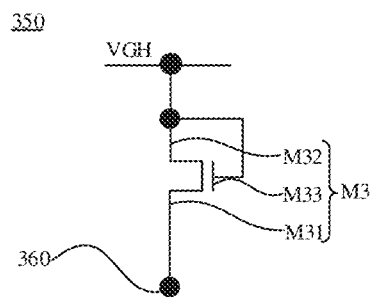
FIG. 8A is a structural diagram of connection of a third sub-circuit, in accordance with some embodiments.

In some embodiments, referring to FIG. 8A, the third sub-circuit 350 includes a third transistor M3. A gate M33 of the third transistor M3 is electrically connected to a second electrode M32 of the third transistor M3, a first electrode M31 of the third transistor M3 is electrically connected to the second connection point 360, and the second electrode M32 of the third transistor M3 is electrically connected to the third voltage signal line VGH.

In the case where the gate M33 of the third transistor M3 is electrically connected to the second electrode M32 of the third transistor M3, the third transistor M3 may be equivalent to a diode. The third transistor M3 is electrically connected between the second connection point 360 and the third voltage signal line VGH.

According to the one-way conduction performance of the diode, when the voltage V360 of the second connection point 360 is higher than the voltage Vgh of the third voltage signal line VGH, and the difference between the voltage V360 of the second connection point 360 and the voltage Vgh of the third voltage signal line VGH is greater than or equal to a certain voltage value Vf (i.e., V360−Vgh≥Vf), the third transistor M3 is turned on. That is to say, the abnormal high voltage at the second connection node 5 turns on the third transistor M3. The second connection point 360 gradually discharges to the third voltage signal line VGH, and the potential of the second connection point 360 gradually decreases, so that the voltage at the second connection node 5 gradually decreases. When the voltage at the second connection node 5 decreases to a value less than the sum of the voltage Vgh of the third voltage signal line VGH and the voltage Vf (i.e., V360<Vgh+Vf), the third transistor M3 does not meet the conduction condition, and the third transistor M3 is turned off.

Figure 8B:
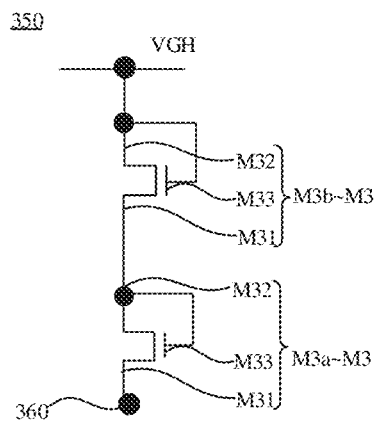
FIG. 8B is a structural diagram of connection of another third sub-circuit, in accordance with some embodiments.
Figure 8C:
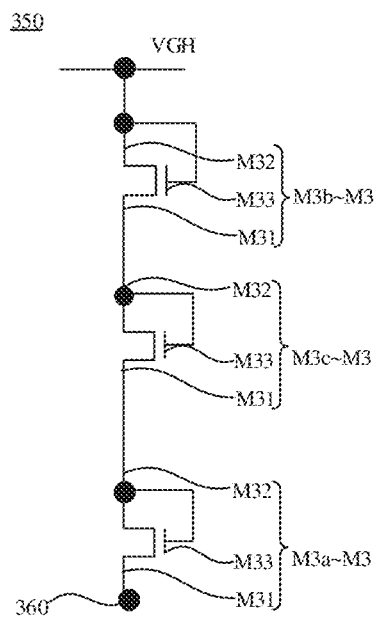
FIG. 8C is a structural diagram of connection of yet another third sub-circuit, in accordance with some embodiments.

In some embodiments, referring to FIGS. 8B and 8C, the third sub-circuit 350 includes at least two third transistors M3 connected in series. The gate M33 of each third transistor M3 is electrically connected to the second electrode M32 thereof, the first electrode M31 of a first third transistor M3a in the at least two third transistors M3 is electrically connected to the second connection point 360, and the second electrode M32 of a last third transistor M3b in the at least two third transistors M3 is electrically connected to the third voltage signal line VGH.

For example, referring to FIG. 8B, the third sub-circuit 350 shown in FIG. 8B includes two third transistors M3 connected in series. The gate M33 of each third transistor M3 is electrically connected to the second electrode M32 thereof, and the two third transistors M3 arranged from bottom to top in FIG. 8B are referred to as the first third transistor M3a and the last third transistor M3b in sequence. The first electrode M31 of the first third transistor M3a is electrically connected to the second connection point 360, the second electrode M32 of the last third transistor M3b is electrically connected to the third voltage signal line VGH, and the second electrode M32 of the first third transistor M3a is electrically connected to the first electrode M31 of the last third transistor M3b. As for the conduction principle of the two third transistors M3 involved in the third sub-circuit 350, reference is made to the above description of the third transistor M3 being equivalent to the diode, which will not be repeated here.

For example, referring to FIG. 8C, the third sub-circuit 350 shown in FIG. 8C includes three third transistors M3 connected in series. The gate M33 of each third transistor M3 is electrically connected to the second electrode M32 thereof, and the three third transistors M3 arranged from bottom to top in FIG. 8C are referred to as the first third transistor M3a, a second third transistor M3c and the last third transistor M3b in sequence. The first electrode M31 of the first third transistor M3a is electrically connected to the second connection point 360, and the second electrode M32 of the last third transistor M3b is electrically connected to the third voltage signal line VGH. The second electrode M32 of the first third transistor M3a is electrically connected to the first electrode M31 of the second third transistor M3c, and the second electrode M32 of the second third transistor M3c is electrically connected to the first electrode M31 of the last third transistor M3b. As for the conduction principle of the three third transistors M3 involved in the third sub-circuit 350, reference is made to the above description of the third transistor M3 being equivalent to the diode, which will not be repeated here.

The third sub-circuit 350 includes at least two third transistors M3 connected in series, which can improve the discharging efficiency of the second connection point 360 to the third voltage signal line VGH, achieve rapid discharging, and further improve the electrostatic protection effect.

Several examples of fourth sub-circuits are provided below, the fourth sub-circuit including at least one fourth transistor.

Figure 9A:
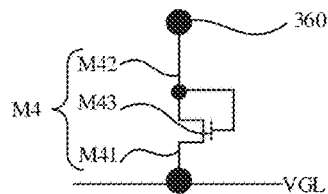
FIG. 9A is a structural diagram of connection of a fourth sub-circuit, in accordance with some embodiments.

In some embodiments, referring to FIG. 9A, the fourth sub-circuit 340 includes a fourth transistor M4. A gate M43 of the fourth transistor M4 is electrically connected to a second electrode M42 of the fourth transistor M4, a first electrode M41 of the fourth transistor M4 is electrically connected to the fourth voltage signal line VGL, and the second electrode M42 of the fourth transistor M4 is electrically connected to the second connection point 360.

The gate M43 of the fourth transistor M4 is electrically connected to the second electrode M42 of the fourth transistor M4. In this case, the fourth transistor M4 may be equivalent to a diode. The fourth transistor M4 is electrically connected between the second connection point 360 and the fourth voltage signal line VGL. According to the one-way conduction performance of the diode, when the voltage V360 of the second connection point 360 is lower than the voltage Vg1 of the fourth voltage signal line VGL, and the difference between the voltage Vg1 of the fourth voltage signal line VGL and the voltage V360 of the second connection point 360 is greater than or equal to a certain voltage value Vf (i.e., Vg1−V360≥Vf), the fourth transistor M4 is turned on. That is to say, the abnormal low voltage at the second connection node 5 turns on the fourth transistor M4. The second connection point 360 is gradually charged by the fourth voltage signal line VGL, and the potential of the second connection point 360 gradually increases, so that the voltage at the second connection node 5 gradually increases. When the voltage at the second connection node 5 increases to a value greater than the difference between the voltage Vg1 of the fourth voltage signal line VGL and the voltage Vf (i.e., V360>Vg1−Vf), the fourth transistor M4 does not meet the conduction condition, and the fourth transistor M4 is turned off.

Figure 9B:
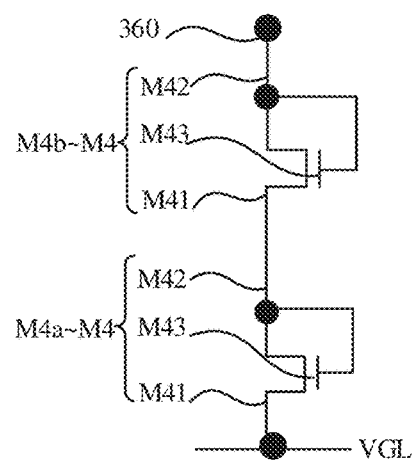
FIG. 9B is a structural diagram of connection of another fourth sub-circuit, in accordance with some embodiments.
Figure 9C:
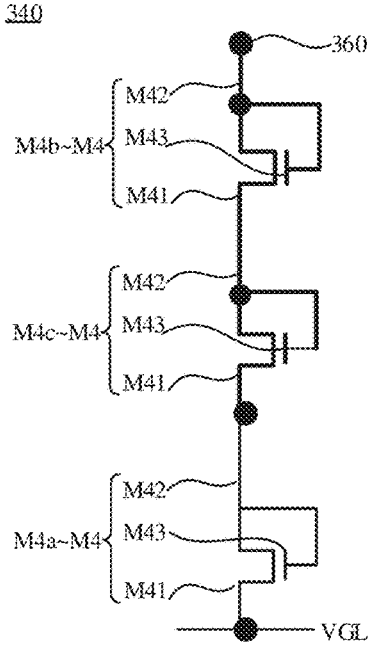
FIG. 9C is a structural diagram of connection of yet another fourth sub-circuit, in accordance with some embodiments.

In some embodiments, referring to FIGS. 9B and 9C, the fourth sub-circuit 340 includes at least two fourth transistors M4 connected in series. The gate M43 of each fourth transistor M4 is electrically connected to the second electrode M42 thereof, the first electrode M41 of a first fourth transistor M4a in the at least two fourth transistors M4 is electrically connected to the fourth voltage signal line VGL, and the second electrode M42 of a last fourth transistor M4b in the at least two fourth transistors M4 is electrically connected to the second connection point 360.

For example, as shown in FIG. 9B, the fourth sub-circuit 340 shown in FIG. 9B includes two fourth transistors M4 connected in series. The gate M43 of each fourth transistor M4 is electrically connected to the second electrode M42 thereof, and the two fourth transistors M4 arranged from bottom to top in FIG. 9B are referred to as the first fourth transistor M4a and the last fourth transistor M4b in sequence. The first electrode M41 of the first fourth transistor M4a is electrically connected to the fourth voltage signal line VGL, the second electrode M42 of the last fourth transistor M4b is electrically connected to the second connection point 360, and the second electrode M42 of the first fourth transistor M4a is electrically connected to the first electrode M41 of the last fourth transistor M4b. As for the conduction principle of the two fourth transistors M4 connected in series involved in the fourth sub-circuit 340, reference is made to the above description of the fourth transistor M4 being equivalent to the diode, which will not be repeated here.

For example, as shown in FIG. 9C, the fourth sub-circuit 340 shown in FIG. 9C includes three fourth transistors M4 connected in series. The gate M43 of each fourth transistor M4 is electrically connected to the second electrode M42 thereof, and the three fourth transistors M4 arranged from bottom to top in FIG. 9C are referred to as the first fourth transistor M4a, a second fourth transistor M4c and the last fourth transistor M4b in sequence. The first electrode M41 of the first fourth transistor M4a is electrically connected to the fourth voltage signal line VGL, and the second electrode M42 of the last fourth transistor M4b is electrically connected to the second connection point 360. The second electrode M42 of the first fourth transistor M4a is electrically connected to the first electrode M41 of the second fourth transistor M4c, and the second electrode M42 of the second fourth transistor M4c is electrically connected to the first electrode M41 of the last fourth transistor M4b. As for the conduction principle of the three fourth transistors M4 connected in series involved in the fourth sub-circuit 340, reference is made to the above description of the fourth transistor M4 being equivalent to the diode, which will not be repeated here.

The fourth sub-circuit 340 includes at least two fourth transistors M4 connected in series, which can improve the charging efficiency of the fourth voltage signal line VGL to the second connection point 360, achieve rapid charging, and further improve the electrostatic protection effect.

As shown in FIGS. 10, 11A to 11E, 12A and 12B, some embodiments of the present disclosure further provide an array substrate 100, and the array substrate 100 includes pixel circuits 10 provided in any of the above embodiments. The array substrate 100 shown in FIGS. 12A and 12B includes a substrate 101, a semiconductor layer 102, a first gate layer 103, a second gate layer 104, a first source-drain metal layer 105, a second source-drain metal layer 107, and a bonding layer 106 that are stacked. These layers are collectively referred to as functional layers in the array substrate, each functional layer has a set pattern, and an insulation layer is provided between adjacent functional layers.

Figure 11A:
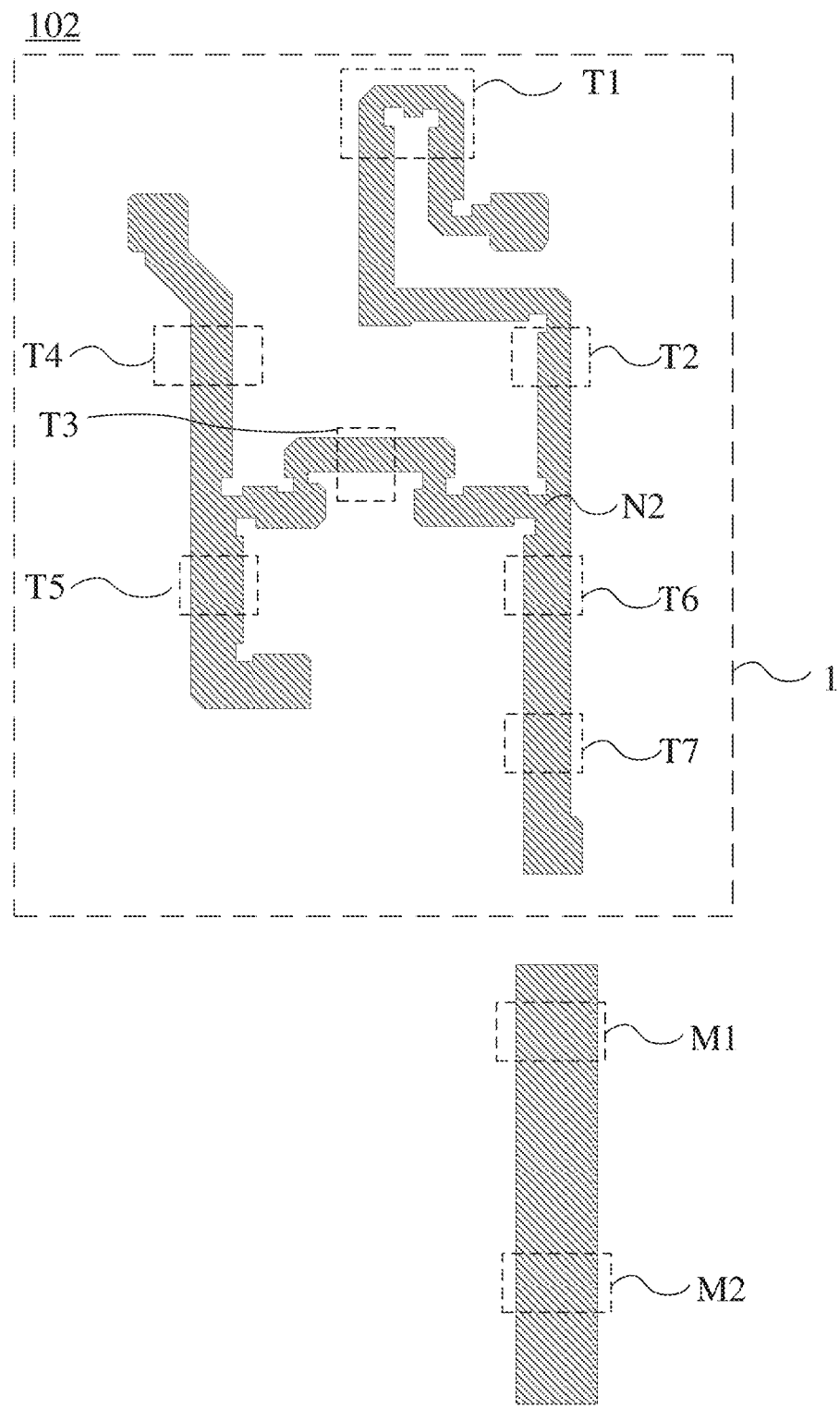
FIG. 11A is another structural diagram of an array substrate, in accordance with some embodiments.
Figure 11B:
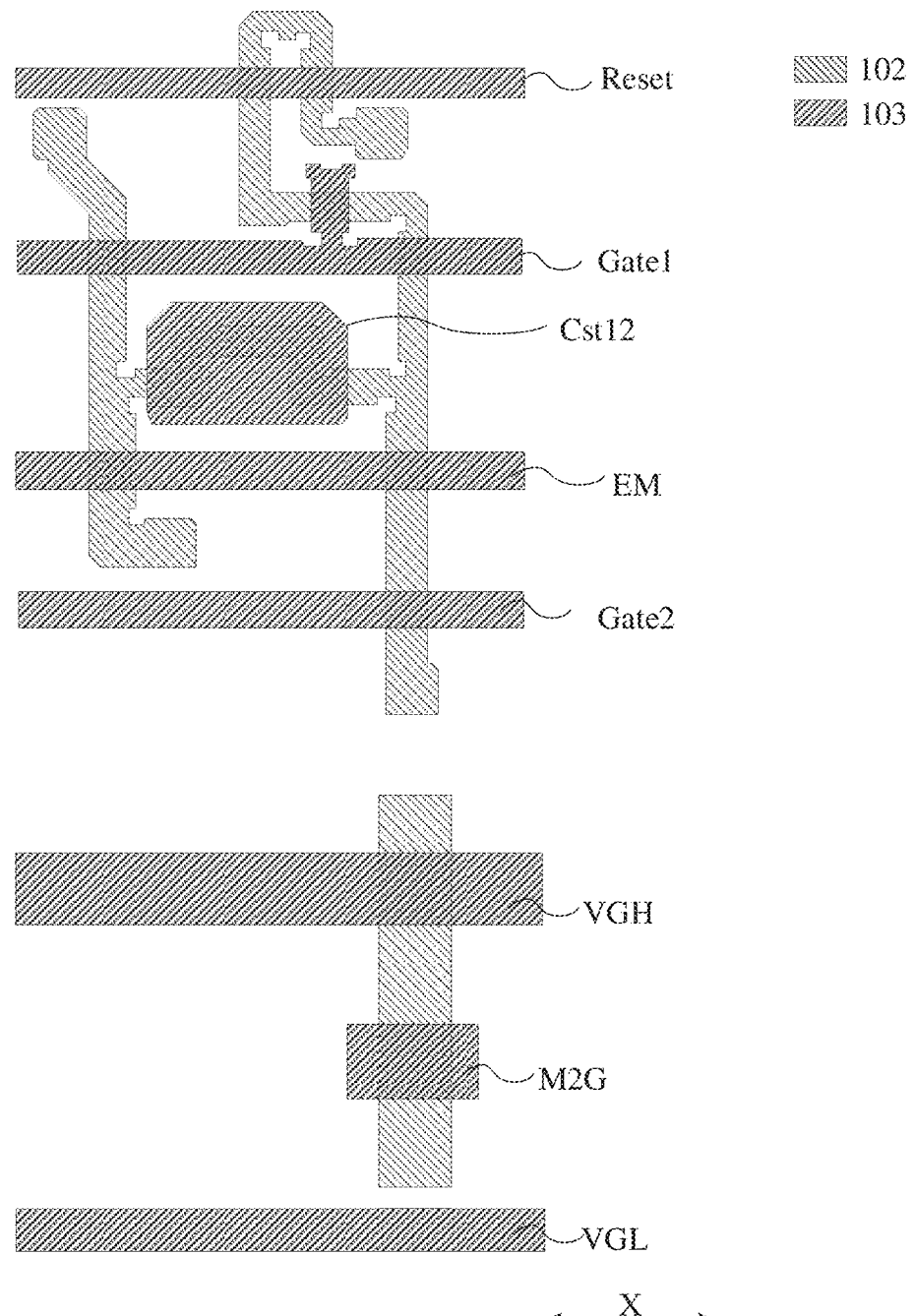
FIG. 11B is yet another structural diagram of an array substrate, in accordance with some embodiments.
Figure 11C:
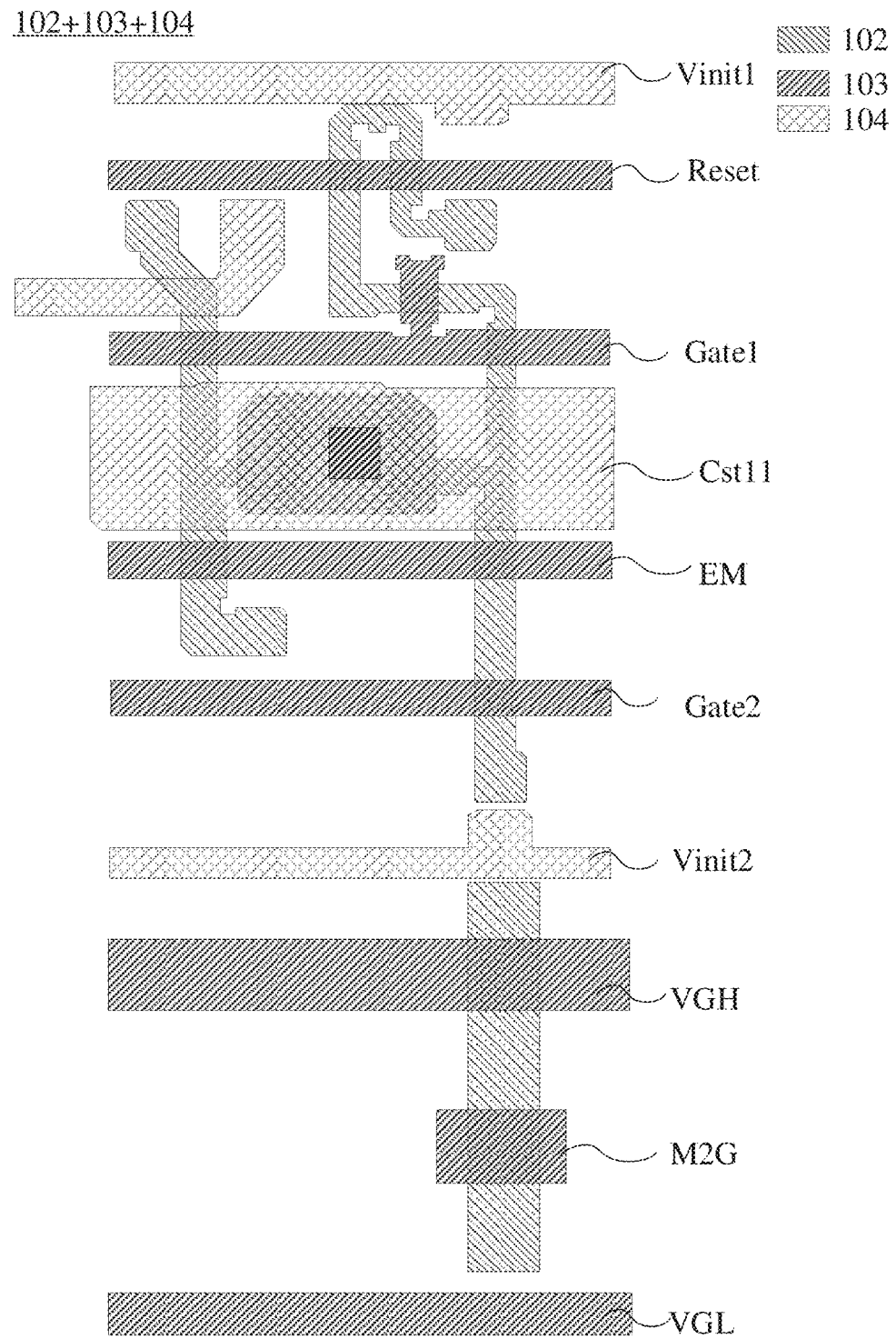
FIG. 11C is yet another structural diagram of an array substrate, in accordance with some embodiments.
Figure 11D:
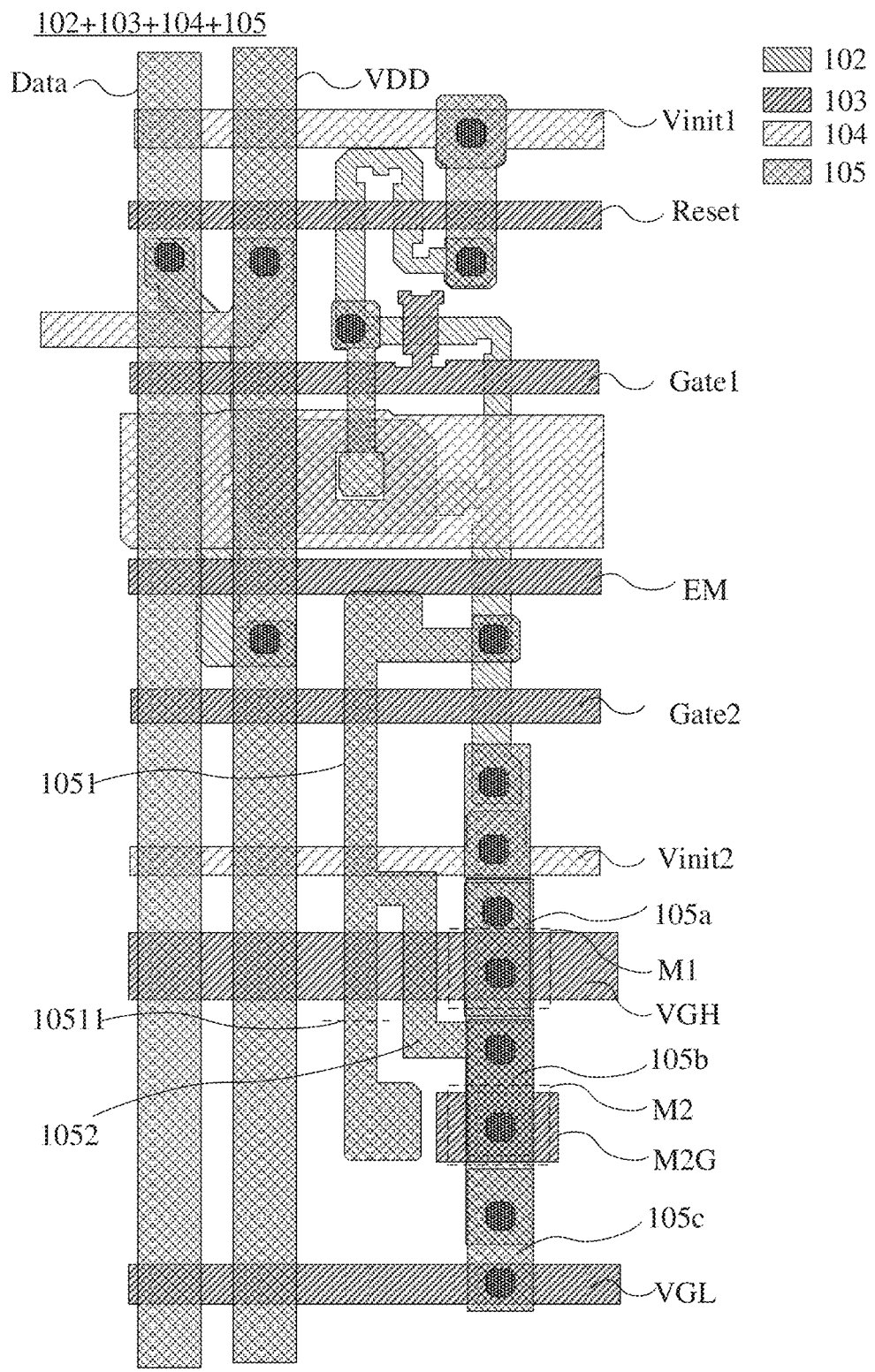
FIG. 11D is yet another structural diagram of an array substrate, in accordance with some embodiments.

Referring to FIGS. 3B and 11A, the structure of each functional layer is introduced by taking the pixel driving circuit with 7T1C as an example. The pixel driving circuit 1 is located in the semiconductor layer 102, the first gate layer 103, the second gate layer 104 and the first source-drain metal layer 105, and the semiconductor layer 102 includes active layers of the first reset transistor T1, the compensation transistor T2, the driving transistor T3, the writing transistor T4, the first light-emitting control transistor T5, the second light-emitting control transistor T6, and the second reset transistor T7. The material of the semiconductor layer 102 may be, for example, an amorphous silicon material, a low-temperature polysilicon, a metal oxide semiconductor, etc., and is not limited here. Referring to FIG. 11B, the first gate layer 103 includes a plurality of signal lines extending along a row direction X, which are the reset signal line Reset, the first scan signal line Gate1, the light-emitting control signal line EM, the second scan signal line Gate2, the third voltage signal line VGH and the fourth voltage signal line VGL, configured to transmit different signals to the transistors. The first gate layer 103 further includes the second electrode plate Cst12 of the first capacitor Cst1. Referring to FIG. 11C, the second gate layer 104 includes the first initialization signal line Vinit1 and the second initialization signal line Vinit2, configured to provide initial signals for transistors. The second gate layer 104 further includes the first electrode plate Cst11 of the first capacitor Cst1, and the second electrode plate Cst12 and the first electrode plate Cst11 overlap to form the first capacitor Cst1. Referring to FIG. 11D, the first source-drain metal layer 105 includes the first data signal line Data1 and the first voltage signal line VDD, which are electrically connected to transistors, and configured for the transistors to transmit the data signal and the voltage signal.

Figure 10:
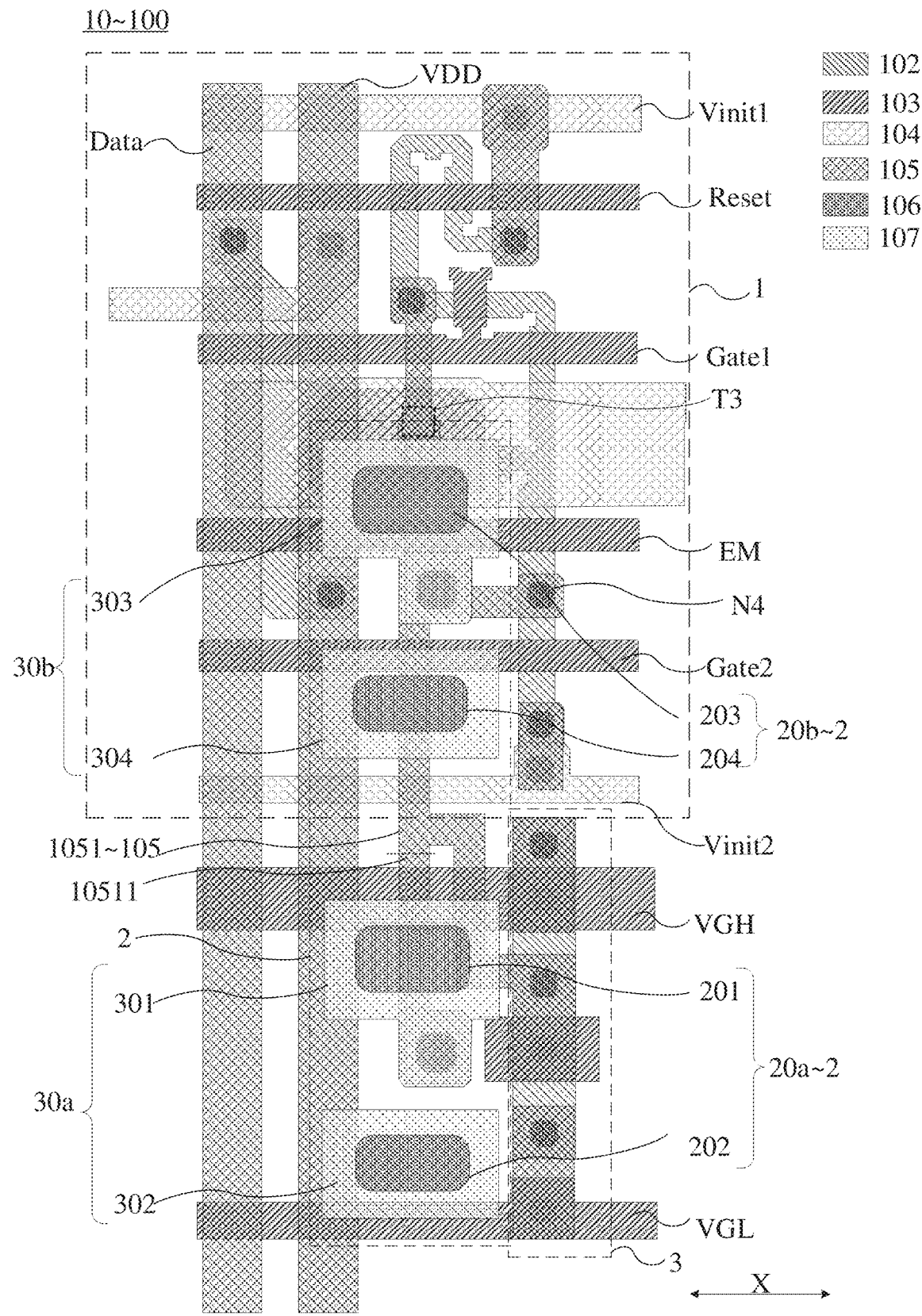
FIG. 10 is a structural diagram of an array substrate, in accordance with some embodiments.
Figure 11E:
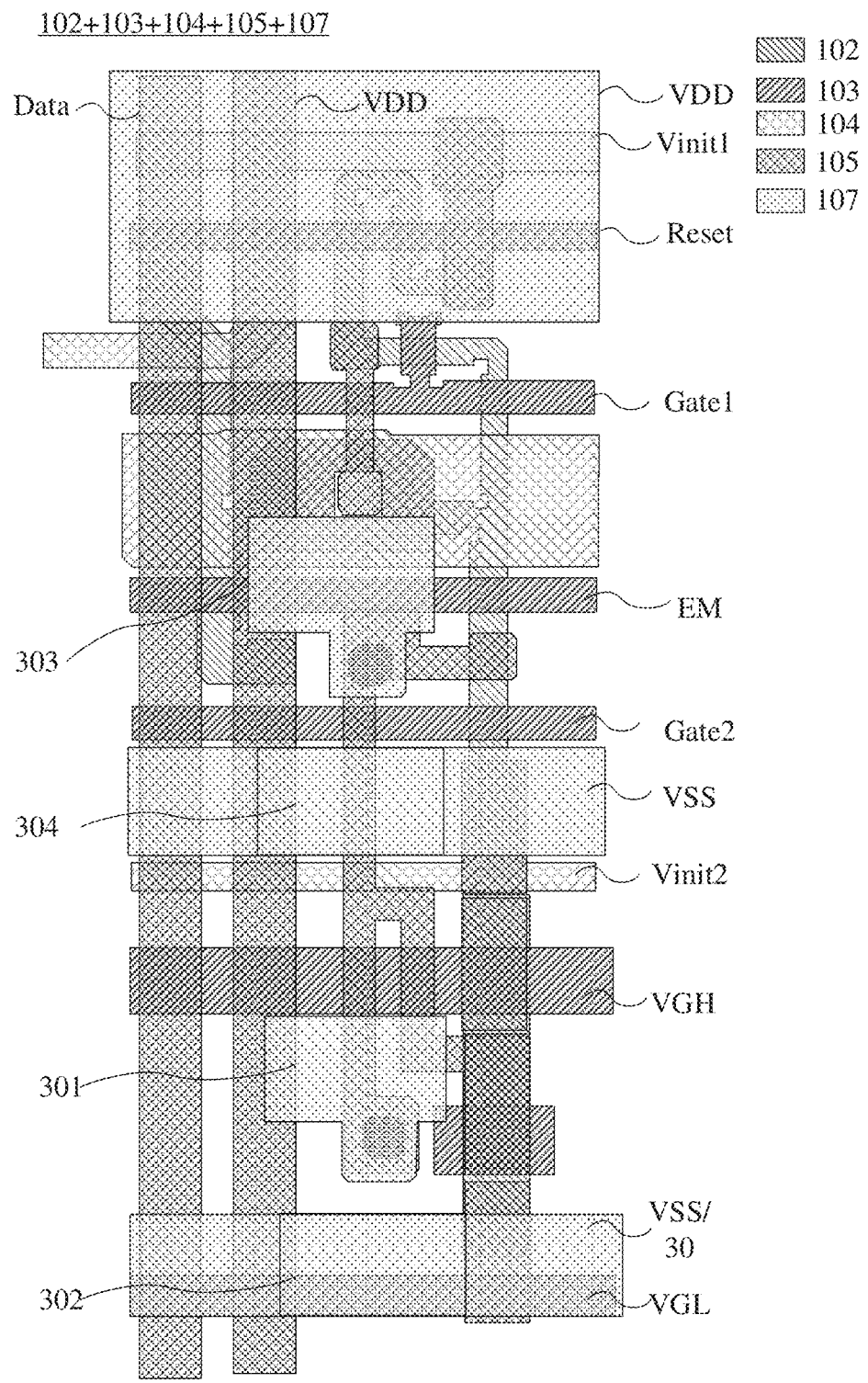
FIG. 11E is yet another structural diagram of an array substrate, in accordance with some embodiments.
Figure 12A:
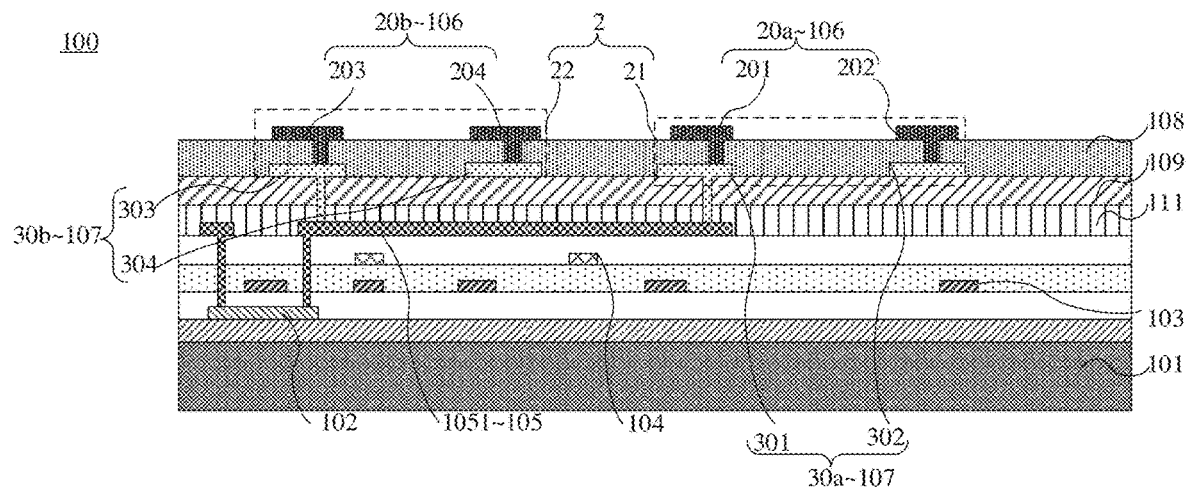
FIG. 12A is a sectional view of an array substrate, in accordance with some embodiments.

The set voltage signal line 30 is located in the first source-drain metal layer 105 or the second source-drain metal layer 107. For example, the set voltage signal line 30 shown in FIG. 11E is located in the second source-drain metal layer 107. Referring to FIGS. 10 and 12A, the bonding unit 2 is located in the bonding layer 106. In a region where at least one pixel circuit 10 is located, the bonding layer 106 includes a first bonding pattern group 20a and at least one second bonding pattern group 20b. The first bonding pattern group 20a includes a first bonding pattern 201 and a second bonding pattern 202, and the second bonding pattern group 20b includes a third bonding pattern 203 and a fourth bonding pattern 204. In combination with FIG. 3A, the first bonding pattern group 20a serves as the first bonding terminal group 21, and the second bonding pattern group 20b serves as the second bonding terminal group 22. The first bonding pattern 201 and the third bonding pattern 203 are both electrically connected to the pixel driving circuit 1, and the second bonding pattern 202 and the fourth bonding pattern 204 are both electrically connected to the set voltage signal line 30.

It should be noted that, if the set voltage signal line 30 is located in the first source-drain metal layer 105, the set voltage signal line 30 is the first voltage signal line VDD, corresponding to the pixel driving circuit with 2T1C shown in FIG. 3C. If the set voltage signal line 30 is located in the second source-drain metal layer 107, the set voltage signal line 30 is the second voltage signal line VSS, corresponding to the pixel driving circuit with 7T1C shown in FIG. 3B. Referring to FIG. 11E, the array substrate is introduced below by taking the set voltage signal line 30 as the second voltage signal line VSS.

Figure 12B:
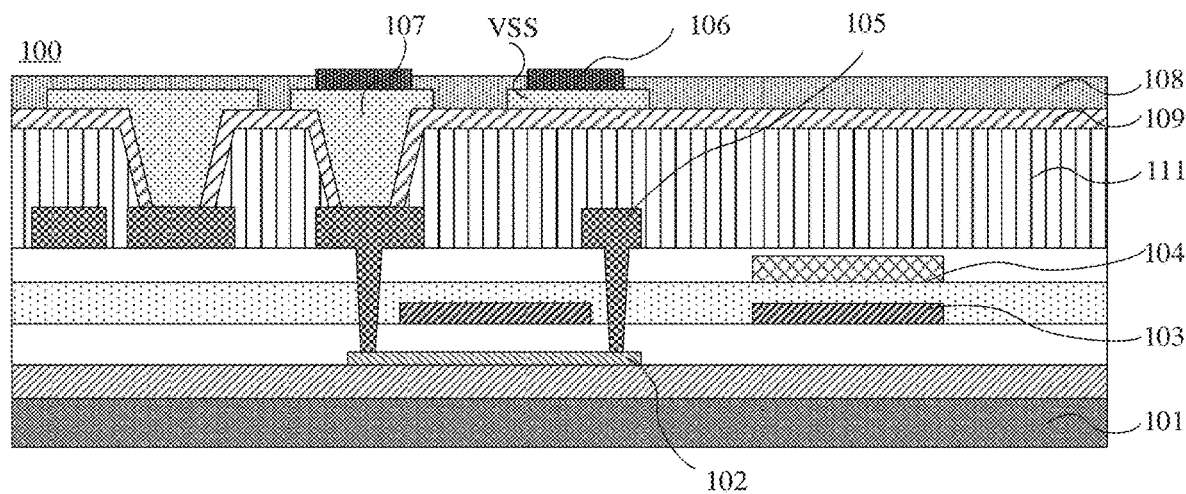
FIG. 12B is another sectional view of an array substrate, in accordance with some embodiments.

For example, referring to FIGS. 10, 11A to 11E, 12A and 12B, FIGS. 11A to 11E are plan views showing structures of the semiconductor layer 102, the first gate layer 103, the second gate layer 104, the first source-drain metal layer 105 and the second source-drain metal layer 107, respectively; FIG. 10 is a plan view showing the pixel circuit corresponding to the pixel driving circuit with 7T1C; and FIGS. 12A and 12B are sectional structural views obtained based on FIG. 10.

As shown in FIG. 10, the bonding layer 106 includes a plurality of bonding patterns used for being connected to positive electrodes or negative electrodes of the light-emitting devices. For example, the positive electrode and the negative electrode of the light-emitting device are respectively in contact with the first bonding pattern 201 and the second bonding pattern 202 in the first bonding pattern group 20a, or the positive electrode and the negative electrode of the light-emitting device are respectively in contact with the third bonding pattern 203 and the fourth bonding pattern 204 in the second bonding pattern group 20b, thereby achieving bonding.

Figure 11F:
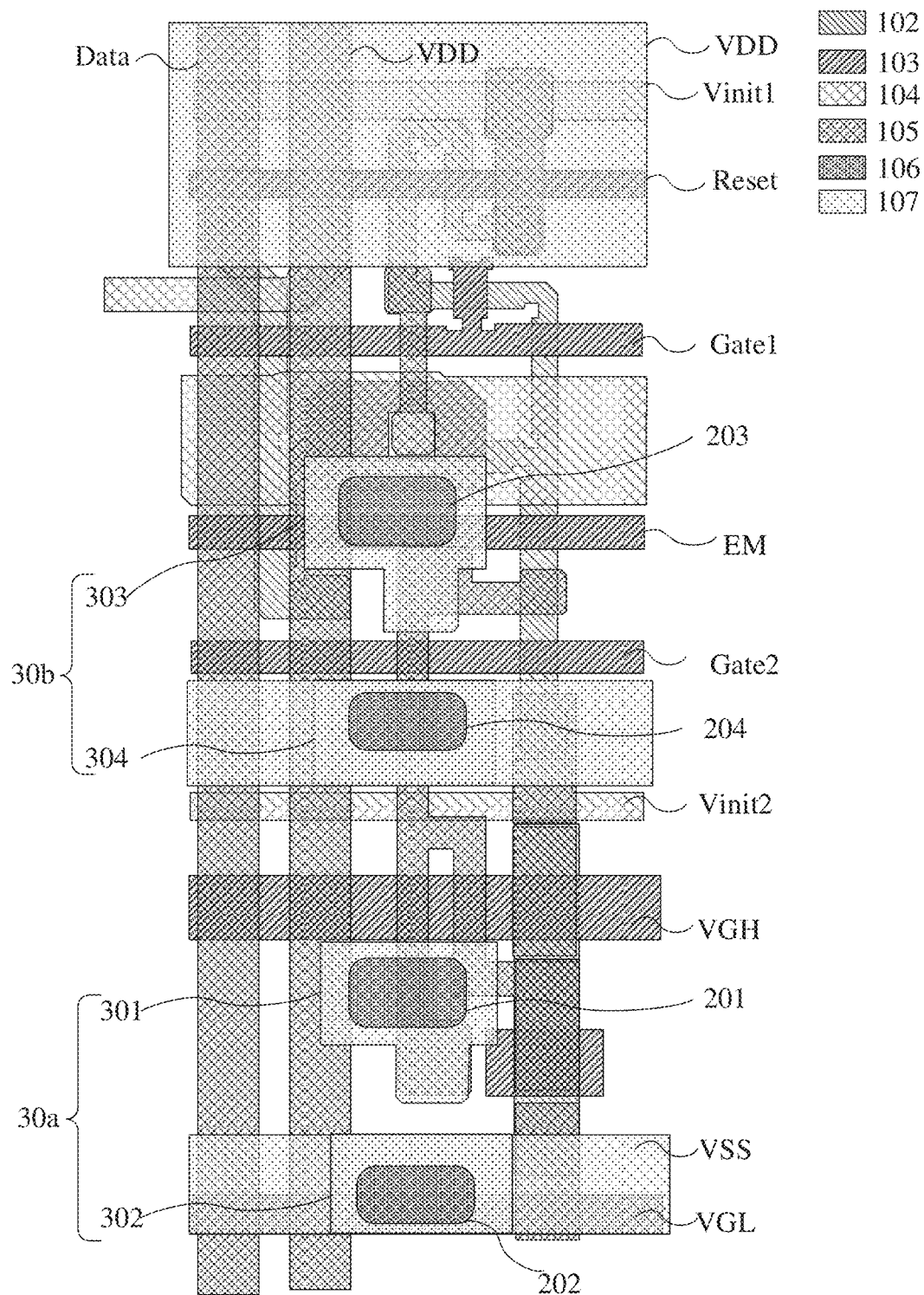
FIG. 11F is yet another structural diagram of an array substrate, in accordance with some embodiments.

In some embodiments, referring to FIG. 11F, the second source-drain metal layer 107 includes a first source-drain pattern group 30a and at least one second source-drain pattern group 30b. The first source-drain pattern group 30a includes a first source-drain pattern 301 and a second source-drain pattern 302, and the second source-drain pattern group 30b includes a third source-drain pattern 303 and a fourth source-drain pattern 304. The first source-drain pattern 301 is electrically connected to the first bonding pattern 201, and the second source-drain pattern 302 is electrically connected to the second bonding pattern 202. The third source-drain pattern 303 is electrically connected to the third bonding pattern 203, and the fourth source-drain pattern 304 is electrically connected to the fourth bonding pattern 204. The first source-drain pattern 301 and the third source-drain pattern 303 are both electrically connected to the pixel driving circuit 1. For example, the first source-drain pattern 301 and the third source-drain pattern 303 are both electrically connected to the fourth node N4 of the pixel driving circuit 1. Referring to FIG. 11E, the second source-drain pattern 302 and the fourth source-drain pattern 304 are both electrically connected to the set voltage signal line 30.

For example, referring to FIGS. 10 and 12A, the second source-drain metal layer 107 shown in FIGS. 10 and 12A includes the first source-drain pattern group 30a and one second source-drain pattern group 30b. The first source-drain pattern group 30a includes the first source-drain pattern 301 and the second source-drain pattern 302. The second source-drain pattern group 30b includes the third source-drain pattern 303 and the fourth source-drain pattern 304. A first insulating layer 108 is disposed between the second source-drain metal layer 107 and the bonding layer 106. The first bonding pattern 201, the second bonding pattern 202, the third bonding pattern 203 and the fourth bonding pattern 204 pass through via holes of the insulating layer 108 to be electrically connected to the first source-drain pattern 301, the second source-drain pattern 302, the third source-drain pattern 303 and the fourth source-drain pattern 304, respectively. That is to say, orthographic projections of the first bonding pattern 201 and the first source-drain pattern 301 on the substrate 101 overlap, orthographic projections of the second bonding pattern 202 and the second source-drain pattern 302 on the substrate 101 overlap, orthographic projections of the third bonding pattern 203 and the third source-drain pattern 303 on the substrate 101 overlap, and orthographic projections of the fourth bonding pattern 204 and the fourth source-drain pattern 304 on the substrate 101 overlap.

It should be noted that, the set voltage signal line 30 is the second voltage signal line VSS, and the pixel driving circuit 1 is connected to the first voltage signal line VDD; the first bonding pattern 201 and the first source-drain pattern 301 form the first terminal 211, the second bonding pattern 202 and the second source-drain pattern 302 form the second terminal 212, the third bonding pattern 203 and the third source-drain pattern 303 form the third terminal 221, and the fourth bonding pattern 204 and the fourth source-drain pattern 304 form the fourth terminal 222. The pixel driving circuit 1 transmits the first voltage signal to the first bonding pattern 201 and the first source-drain pattern 301 or to the third bonding pattern 203 and the third source-drain pattern 303, and the set voltage signal line 30 transmits the second voltage signal to the second bonding pattern 202 and the second source-drain pattern 302 or to the fourth bonding pattern 204 and the fourth source-drain pattern 304.

In some embodiments, referring to FIG. 10, the connection between the pixel driving circuit 1 and both the first source-drain pattern 301 and the third source-drain pattern 303 is as follows. The first source-drain metal layer 105 includes a first connection line 1051, the first connection line 1051 is connected to the pixel driving circuit 1, and the first connection line 1051 is also connected to the first source-drain pattern 301 and the third source-drain pattern 303.

For example, referring to FIGS. 10 and 11D, a first end of the first connection line 1051 is in contact with the semiconductor layer through a via hole located between the first source-drain metal layer and the semiconductor layer. For example, the first connection line 1051 is electrically connected to the connection position (fourth node N4) of the active layer of the second reset transistor T7 and the active layer of the second light-emitting control transistor T6 through the via hole. Referring to FIGS. 10, 11E, 12A and 12B, a second insulating layer 109 and a flat layer 111 are disposed between the first source-drain metal layer 105 and the second source-drain metal layer 107, and the first connection line 1051 is electrically connected to the first source-drain pattern 301 and the third source-drain pattern 303 through via holes penetrating through the second insulating layer 109 and the flat layer 111. The first connection line 1051 is configured to transmit the voltage signal in the pixel driving circuit 1 to the first source-drain pattern 301 and the third source-drain pattern 303.

In some embodiments, referring to FIG. 7, the first terminal 211 and the third terminal 221 are connected to the first connection node 4; as shown in FIG. 10, the first connection line 1051 includes a connection portion 10511 located in the middle position of the first connection line 1051, the connection portion 10511 serves as the first connection node 4, and the first source-drain pattern group 30a and the second source-drain pattern group 30b are both non-overlapping with the connection portion 10511.

For example, when a failure occurs in the bonding process of the light-emitting device, the connection portion 10511 serves as the first connection node 4, and this position can be cut off, so that the first bonding terminal group (the first bonding pattern group 20a and the first source-drain pattern group 30a) is independent from the pixel driving circuit and the second bonding terminal group (the second bonding pattern group 20b and the second source-drain pattern group 30b), which facilitates maintenance.

In some embodiments, referring to FIGS. 11A and 10, the pixel driving circuit 1 includes the driving transistor T3; the semiconductor layer 102 includes an active layer of the driving transistor T3, and the first source-drain pattern group 30a and the second source-drain pattern group 30b are both non-overlapping with the active layer of the driving transistor T3.

It should be noted that the first source-drain pattern group 30a and the second source-drain pattern group 30b are used to bond light-emitting devices. Since the light-emitting device undergoes high-temperature and high-pressure processes during mass transfer, in order to ensure that the stability of transistor operation, the first source-drain pattern group 30a and the second source-drain pattern group 30b are arranged to have no overlap with the active layer of the driving transistor T3, thereby ensuring that the light-emitting device has no overlap with the active layer of the driving transistor T3, avoiding adverse effects on the driving transistor T3, and avoiding affecting the normal operation of the pixel circuit.

In some embodiments, referring to FIG. 4, the pixel circuit 10 further includes an electrostatic protection circuit 3, and the electrostatic protection circuit 3 includes a first transistor M1 and a second transistor M2. As shown in FIG. 11A, the semiconductor layer 102 includes an active layer of the first transistor M1 and an active layer of the second transistor M2, and a first end of the active layer of the first transistor M1 and a second end of the active layer of the second transistor M2 are close to and connected to each other. Referring to FIGS. 11B and 11D, the first gate layer 103 includes the third voltage signal line VGH, the fourth voltage signal line VGL, and a gate pattern M2G of the second transistor M2; the first source-drain metal layer 105 includes a first connection pattern 105a, a second connection pattern 105b, a third connection pattern 105c and a second connection line 1052.

A second end of the active layer of the first transistor M1 is connected to the first connection pattern 105a, and the first connection pattern 105a is connected to the third voltage signal line VGH. For example, the first connection pattern 105a is connected to the second end of the active layer of the first transistor M1 through a via hole penetrating to the semiconductor layer 102, and the first connection pattern 105a is connected to the third voltage signal line VGH through a via hole penetrating to the first gate layer 103; the third voltage signal line VGH overlaps with the active layer of the first transistor M1, and the overlapping portion serves as the gate of the first transistor M1. Thus, both the second electrode and the gate of the first transistor M1 are connected to the third voltage signal line VGH.

The first end of the active layer of the first transistor M1 is connected to the second connection pattern 105b, and the second connection pattern 105b is connected to the gate pattern M2G of the second transistor M2; and the gate pattern of the second transistor M2 overlaps with the active layer of the second transistor M2. For example, the second connection pattern 105b is connected to the first end of the active layer of the first transistor M1 through a via hole penetrating to the semiconductor layer 102, and the second connection pattern 105b is further connected to the gate pattern M2G of the second transistor M2 through a via hole penetrating to the first gate layer, so that the first electrode of the first transistor M1 is connected to the gate of the second transistor M2. The first end of the first transistor M1 and the second end of the second transistor M2 are connected at the semiconductor layer.

A first end of the active layer of the second transistor M2 is connected to the third connection pattern 105c, and the third connection pattern 105c is connected to the fourth voltage signal line VGL. For example, the third connection pattern 105c is connected to the first end of the active layer of the second transistor M2 through a via hole penetrating to the semiconductor layer, and the third connection pattern 105c is further connected to the fourth voltage signal line VGL through a via hole penetrating to the first gate layer 103, so that the first electrode of the second transistor M2 is connected to the fourth voltage signal line VGL.

As shown in FIG. 11D, both ends of the second connection line 1052 are connected to the first connection line 1051 and the second connection pattern 105b, respectively. In this way, the second connection pattern 105b is equivalent to the first connection point 330, the first connection line 1051 is equivalent to the first connection node 4, and the first connection point 330 is connected to the first connection node 4 through the second connection line 1052.

The layer structure of the first electrostatic protection circuit 31 in the electrostatic protection circuit 3 is introduced above. As for the layer structure of the second electrostatic protection circuit 32, reference is made to the description of the first electrostatic protection circuit 31.

It should be noted that, the first end of the active layer of the first transistor M1 is equivalent to the first electrode M11 of the first transistor M1, and the second end of the active layer of the first transistor M1 is equivalent to the second electrode M12 of the first transistor M1. The first end of the active layer of the second transistor M2 is equivalent to the first terminal M21 of the second transistor M2, and the second end of the active layer of the second transistor M2 is equivalent to the second electrode M22 of the second transistor M2.

In some embodiments, the plurality of pixel circuits 10 are arranged in an array; the first gate layer 103 includes a plurality of third voltage signal lines VGH and a plurality of fourth voltage signal lines VGL extending along the row direction X. As shown in FIG. 10, each third voltage signal line VGH and each fourth voltage signal line VGL are located in the region where one row of pixel circuits 10 is located. It can be understood that, the plurality of pixel circuits 10 are disposed in the array substrate 100, and the plurality of pixel circuits 10 are arranged in an array. Referring to FIG. 10, which is a structural diagram of a pixel circuit, it can be seen from FIG. 10 that the third voltage signal line VGH and the fourth voltage signal line VGL extend along the row direction X, and each third voltage signal line VGH and each fourth voltage signal line VGL are located in the region where one row of pixel circuits 10 is located.

Figure 13:
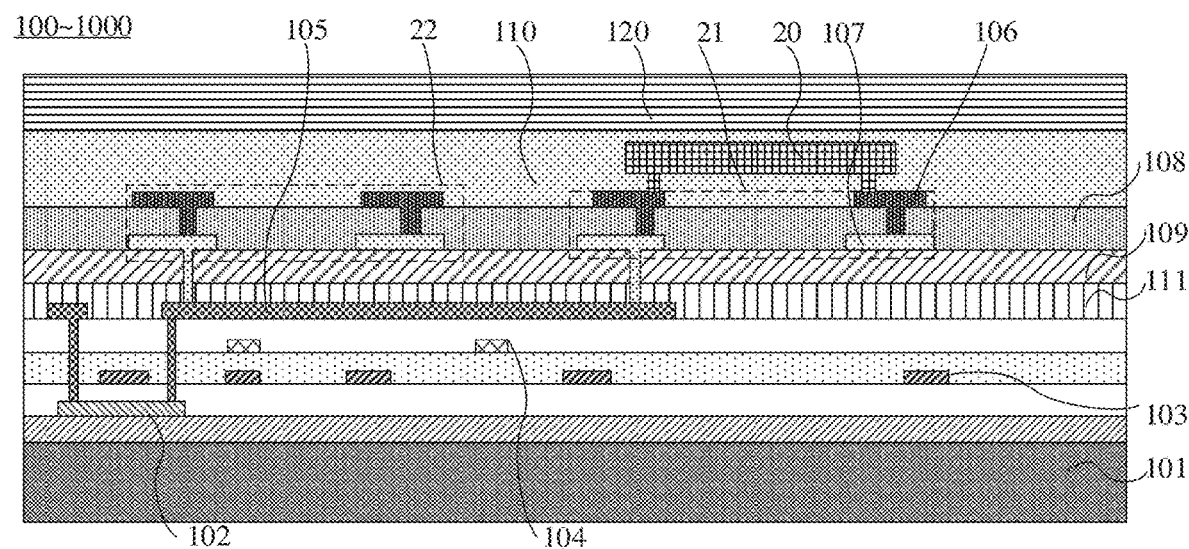
FIG. 13 is a sectional view showing a structure of a display panel, in accordance with some embodiments.

Referring to FIG. 13, some embodiments of the present disclosure further provide a display panel 1000, and the display panel 1000 includes the array substrate 100 provided in any of the above embodiments and a plurality of light-emitting devices 20. Each of the plurality of light-emitting devices 20 is electrically connected to the first bonding terminal group 21 or the second bonding terminal group 22 in the array substrate 100.

The display panel 1000 further includes a light-emitting device layer and an encapsulation layer 120. The light-emitting device layer includes the plurality of light-emitting devices 20 and a protective adhesive layer 110. The protective adhesive layer 110 fills gaps between the plurality of light-emitting devices 20 and covers surfaces of the light-emitting devices 20. First bonding terminal groups 21 or second bonding terminal groups 22 are used to bond the light-emitting devices 20. FIG. 13 illustrates a case where the light-emitting device 20 is bonded to the first bonding terminal group 21. The encapsulation layer 120 is disposed on the light-emitting device layer and is configured to protect the light-emitting device 20, and prevent the light-emitting device 20 from being corroded by water and oxygen, which may cause poor display of the display panel 1000. Thus, the yield rate of the display panel 1000 is improved.

The embodiments of the present disclosure do not particularly limit a specific form of the display panel. Therefore, the display panel 1000 provided in the embodiments of the present disclosure has all the beneficial effects of the array substrate 100 provided in any of the above embodiments, which will not be repeated here.

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure should be determined by the protection scope of the claims.

What is claimed is:

1. A pixel circuit, comprising:
a pixel driving circuit;
a bonding unit connected to the pixel driving circuit, wherein the bonding unit includes a first bonding terminal group and at least one second bonding terminal group that are arranged in parallel, and the first bonding terminal group and a second bonding terminal group are configured to bond light-emitting devices, wherein
the first bonding terminal group includes a first terminal and a second terminal, and the second bonding terminal group includes a third terminal and a fourth terminal; the first terminal and the third terminal are connected, and are both connected to the pixel driving circuit; the second terminal and the fourth terminal are connected, and are both connected to a set voltage signal line.

2. The pixel circuit according to claim 1, wherein the pixel driving circuit is electrically connected to one of a first voltage signal line and a second voltage signal line, and the set voltage signal line is another one of the first voltage signal line and the second voltage signal line;
wherein the first voltage signal line is configured to transmit a first voltage signal, the second voltage signal line is configured to transmit a second voltage signal, and a voltage of the first voltage signal is greater than a voltage of the second voltage signal.

3. The pixel circuit according to claim 2, further comprising an electrostatic protection circuit, wherein
the first terminal and the third terminal are connected to a first connection node, and the electrostatic protection circuit is electrically connected to the first connection node;
the electrostatic protection circuit includes a first electrostatic protection circuit, and the first electrostatic protection circuit includes a first sub-circuit and a second sub-circuit; a first terminal of the first sub-circuit and a second terminal of the second sub-circuit are electrically connected to a first connection point; a second terminal of the first sub-circuit is electrically connected to a third voltage signal line, and a first terminal of the second sub-circuit is electrically connected to a fourth voltage signal line; the third voltage signal line is configured to transmit a third voltage signal, and the fourth voltage signal line is configured to transmit a fourth voltage signal; a voltage of the third voltage signal is greater than a voltage of the fourth voltage signal;
the first sub-circuit is configured to be turned on when an abnormal high voltage occurs at the first connection node, so that the first connection point discharges to the third voltage signal line; and the second sub-circuit is configured to be turned on when an abnormal low voltage occurs at the first connection node, so that the fourth voltage signal line charges the first connection point.

4. The pixel circuit according to claim 3, wherein the first sub-circuit includes at least one first transistor;
the first sub-circuit includes one first transistor; a gate of the first transistor is electrically connected to a second electrode thereof, a first electrode of the first transistor is electrically connected to the first connection point, and the second electrode of the first transistor is electrically connected to the third voltage signal line; or
the first sub-circuit includes at least two first transistors connected in series; a gate of each first transistor is electrically connected to a second electrode thereof, a first electrode of a first transistor in the at least two first transistors is electrically connected to the first connection point, and a second electrode of a last first transistor in the at least two first transistors is electrically connected to the third voltage signal line.

5. The pixel circuit according to claim 3, wherein the second sub-circuit includes at least one second transistor;
the second sub-circuit includes one second transistor; a gate of the second transistor is electrically connected to a second electrode thereof, a first electrode of the second transistor is electrically connected to the fourth voltage signal line, and the second electrode of the second transistor is electrically connected to the first connection point; or
the second sub-circuit includes at least two second transistors connected in series; a gate of each second transistor is electrically connected to a second electrode thereof, a first electrode of a first second transistor in the at least two second transistors is electrically connected to the fourth voltage signal line, and a second electrode of a last second transistor in the at least two second transistors is electrically connected to the first connection point.

6. The pixel circuit according to claim 3, wherein the second terminal and the fourth terminal are connected to a second connection node, and the electrostatic protection circuit is further electrically connected to the second connection node;

the electrostatic protection circuit further includes a second electrostatic protection circuit, and the second electrostatic protection circuit includes a third sub-circuit and a fourth sub-circuit; a first terminal of the third sub-circuit and a second terminal of the fourth sub-circuit are electrically connected to a second connection point; a second terminal of the third sub-circuit is electrically connected to the third voltage signal line; a first terminal of the fourth sub-circuit is electrically connected to the fourth voltage signal line;

the third sub-circuit is configured to be turned on when an abnormal high voltage occurs at the second connection node, so that the second connection point discharges to the third voltage signal line; and the fourth sub-circuit is configured to be turned on when an abnormal low voltage occurs at the second connection node, so that the fourth voltage signal line charges the second connection point.

7. The pixel circuit according to claim 6, wherein the third sub-circuit includes at least one third transistor;

the third sub-circuit includes one third transistor; a gate of the third transistor is electrically connected to a second electrode thereof, a first electrode of the third transistor is electrically connected to the second connection point, and the second electrode of the third transistor is electrically connected to the third voltage signal line; or the third sub-circuit includes at least two third transistors connected in series; a gate of each third transistor is electrically connected to a second electrode thereof, a first electrode of a first third transistor in the at least two third transistors is electrically connected to the second connection point, and a second electrode of a last third transistor in the at least two third transistors is electrically connected to the third voltage signal line.

8. The pixel circuit according to claim 6, wherein the fourth sub-circuit includes at least one fourth transistor;

the fourth sub-circuit includes one fourth transistor; a gate of the fourth transistor is electrically connected to a second electrode thereof, a first electrode of the fourth transistor is electrically connected to the fourth voltage signal line, and the second electrode of the fourth transistor is electrically connected to the second connection point; or the fourth sub-circuit includes at least two fourth transistors connected in series; a gate of each fourth transistor is electrically connected to a second electrode thereof, a first electrode of a first fourth transistor in the at least two fourth transistors is electrically connected to the fourth voltage signal line, and a second electrode of a last fourth transistor in the at least two fourth transistors is electrically connected to the second connection point.

9. The pixel circuit according to claim 1, wherein the pixel driving circuit includes a first reset transistor, a compensation transistor, a driving transistor, a writing transistor, a first light-emitting control transistor, a second light-emitting control transistor, a second reset transistor and a first capacitor;

in the first reset transistor, a gate is electrically connected to a reset signal line, a first electrode is electrically connected to a first node, and a second electrode is electrically connected to a first initialization signal line;

in the compensation transistor, a gate is electrically connected to a first scan signal line, a first electrode is electrically connected to the first node, and a second electrode is electrically connected to a second node;

in the driving transistor, a gate is electrically connected to the first node, a first electrode is electrically connected to a third node, and a second electrode is electrically connected to the second node;

in the writing transistor, a gate is electrically connected to the first scan signal line, a first electrode is electrically connected to the third node, and a second electrode is electrically connected to a first data signal line;

in the first light-emitting control transistor, a gate is electrically connected to a light-emitting control signal line, a first electrode is electrically connected to a first voltage signal line, and a second electrode is electrically connected to the third node;

in the second light-emitting control transistor, a gate is electrically connected to the light-emitting control signal line, a first electrode is electrically connected to the second node, and a second electrode is electrically connected to a fourth node;

in the second reset transistor, a gate is electrically connected to a second scan signal line, a first electrode is electrically connected to a second initialization signal line, and a second electrode is electrically connected to the fourth node; and in the first capacitor, a first electrode plate is electrically connected to the first voltage signal line, and a second electrode plate is electrically connected to the first node.

10. The pixel circuit according to claim 9, wherein the fourth node of the pixel driving circuit is electrically connected to the first terminal and the third terminal of the bonding unit.

11. An array substrate, comprising a plurality of pixel circuits according to claim 1, wherein the array substrate includes a substrate, a semiconductor layer, a first gate layer, a second gate layer, a first source-drain metal layer, a second source-drain metal layer, and a bonding layer that are stacked; the set voltage signal line is located in one of the first source-drain metal layer or the second source-drain metal layer;

the pixel driving circuit is located in the semiconductor layer, the first gate layer, the second gate layer and the first source-drain metal layer;

the bonding unit is located in the bonding layer; in a region where at least one pixel circuit is located, the bonding layer includes a first bonding pattern group and at least one second bonding pattern group, the first bonding pattern group includes a first bonding pattern and a second bonding pattern, and a second bonding pattern group includes a third bonding pattern and a fourth bonding pattern;

the first bonding pattern group serves as the first bonding terminal group, and the second bonding pattern group serves as the second bonding terminal group;

the first bonding pattern and the third bonding pattern are both electrically connected to the pixel driving circuit, and the second bonding pattern and the fourth bonding pattern are both electrically connected to the set voltage signal line.

12. The array substrate according to claim 11, wherein the second source-drain metal layer includes a first source-drain pattern group and at least one second source-drain pattern group; the first source-drain pattern group includes a first source-drain pattern and a second source-drain pattern, and a second source-drain pattern group includes a third source-drain pattern and a fourth source-drain pattern;

the first source-drain pattern is electrically connected to the first bonding pattern, and the second source-drain pattern is electrically connected to the second bonding pattern; the third source-drain pattern is electrically connected to the third bonding pattern, and the fourth source-drain pattern is electrically connected to the fourth bonding pattern;

the first source-drain pattern and the third source-drain pattern are both electrically connected to the pixel driving circuit, and the second source-drain pattern and the fourth source-drain pattern are both electrically connected to the set voltage signal line.

13. The array substrate according to claim 12, wherein the first source-drain metal layer includes a first connection line, the first connection line is connected to the pixel driving circuit, and the first connection line is further connected to the first source-drain pattern and the third source-drain pattern.

14. The array substrate according to claim 13, wherein the first terminal and the third terminal are connected to a first connection node;

the first connection line includes a connection portion located in a middle position of the first connection line, the connection portion serves as the first connection node, and the first source-drain pattern group and the second source-drain pattern group are both non-overlapping with the connection portion.

15. The array substrate according to claim 13, wherein the pixel circuit further includes an electrostatic protection circuit, and the electrostatic protection circuit includes a first transistor and a second transistor;

the semiconductor layer includes an active layer of the first transistor and an active layer of the second transistor, and a first end of the active layer of the first transistor and a second end of the active layer of the second transistor are close to and connected to each other;

the first source-drain metal layer includes a first connection pattern, a second connection pattern, a third connection pattern and a second connection line;

a second end of the active layer of the first transistor is connected to the first connection pattern, and the first connection pattern is further connected to a third voltage signal line; the third voltage signal line overlaps with the active layer of the first transistor;

the first end of the active layer of the first transistor is further connected to the second connection pattern, and the second connection pattern is further connected to a gate pattern of the second transistor; the gate pattern of the second transistor overlaps with the active layer of the second transistor;

a first end of the active layer of the second transistor is connected to the third connection pattern, and the third connection pattern is further connected to a fourth voltage signal line; and both ends of the second connection line are connected to the first connection line and the second connection pattern.

16. The array substrate according to claim 15, wherein the plurality of pixel circuits are arranged in an array;

the first gate layer includes a plurality of third voltage signal lines and a plurality of fourth voltage signal lines extending along a row direction; and each third voltage signal line and each fourth voltage signal line are located in a region where a row of pixel circuits is located.

17. The array substrate according to claim 12, wherein the pixel driving circuit includes a driving transistor; the semiconductor layer includes an active layer of the driving transistor, and the first source-drain pattern group and the second source-drain pattern group are both non-overlapping with the active layer of the driving transistor.

18. The array substrate according to claim 11, wherein the set voltage signal line is located in the first source-drain metal layer, and the set voltage signal line is a first voltage signal line; or the set voltage signal line is located in the second source-drain metal layer, and the set voltage signal line is a second voltage signal line.

19. A display panel, comprising:
the array substrate according to claim 11;
a plurality of light-emitting devices, wherein each of the plurality of light-emitting devices is electrically connected to the first bonding terminal group or the second bonding terminal group in the array substrate.

20. The display panel according to claim 19, wherein the light-emitting device is one of a micro organic light-emitting diode (micro OLED), a quantum dot light-emitting diode (QLED), a mini light-emitting diode (mini LED) or a micro light-emitting diode (micro LED).

* * * * *